US011984363B2

(12) United States Patent
Chen et al.

(10) Patent No.: US 11,984,363 B2
(45) Date of Patent: May 14, 2024

(54) DUAL SILICIDE STRUCTURE AND METHODS THEREOF

(71) Applicant: Taiwan Semiconductor Manufacturing Co., Ltd., Hsin-Chu (TW)

(72) Inventors: Shih-Cheng Chen, New Taipei (TW); Chun-Hsiung Lin, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/070,268

(22) Filed: Nov. 28, 2022

(65) Prior Publication Data
US 2023/0103862 A1 Apr. 6, 2023

Related U.S. Application Data

(63) Continuation of application No. 17/166,704, filed on Feb. 3, 2021, now Pat. No. 11,515,216.

(60) Provisional application No. 62/982,211, filed on Feb. 27, 2020.

(51) Int. Cl.
*H01L 21/8238* (2006.01)
*H01L 27/092* (2006.01)
*H01L 29/161* (2006.01)

(52) U.S. Cl.
CPC ........... *H01L 21/823814* (2013.01); *H01L 21/823821* (2013.01); *H01L 27/0924* (2013.01); *H01L 29/161* (2013.01)

(58) Field of Classification Search
CPC ..... H01L 21/823814; H01L 21/823821; H01L 27/0924; H01L 29/161; H01L 21/76843; H01L 21/76855; H01L 21/76897; H01L 23/485; H01L 29/78618; H01L 29/0673; H01L 29/0847; H01L 21/28518; H01L 29/165; H01L 29/775; H01L 29/7848; H01L 21/823475; H01L 27/092;
(Continued)

(56) References Cited

U.S. PATENT DOCUMENTS 8,772,109 B2   7/2014  Colinge
8,785,285 B2   7/2014  Tsai et al.
8,816,444 B2   8/2014  Wann et al.
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

A semiconductor device includes a semiconductor substrate, a first epitaxial feature having a first semiconductor material over the semiconductor substrate, and a second epitaxial feature having a second semiconductor material over the semiconductor substrate. The second semiconductor material being different from the first semiconductor material. The semiconductor device further includes a first silicide layer on the first epitaxial feature, a second silicide layer on the second epitaxial feature, a metal layer on the first silicide layer, a first contact feature over the metal layer, and a second contact feature over the second silicide layer. A first number of layers between the first contact feature and the first epitaxial feature is greater than a second number of layers between the second contact feature and the second epitaxial feature.

20 Claims, 15 Drawing Sheets

(58) Field of Classification Search
CPC ........... H01L 29/66795; H01L 29/1033; H01L 29/401; B82Y 10/00
See application file for complete search history.

(56) References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,595,592 B1* | 3/2017 | Ok | H01L 21/823871 |
| 2016/0086950 A1* | 3/2016 | Eom | H01L 21/76897 |
| | | | 257/192 |
| 2018/0219077 A1* | 8/2018 | Wang | H01L 29/785 |
| 2019/0157406 A1 | 5/2019 | Hwang et al. | |

\* cited by examiner

DUAL SILICIDE STRUCTURE AND METHODS THEREOF

PRIORITY DATA

The is a continuation application of U.S. patent application Ser. No. 17/166,704, filed Feb. 3, 2021, which claims priority to U.S. Provisional Patent Application No. 62/982,211, filed on Feb. 27, 2020, entitled "Dual Silicide Structure and Methods Thereof," the entire disclosures of which are hereby incorporated by reference.

BACKGROUND

The integrated circuit (IC) industry has experienced exponential growth. Technological advances in IC materials and designs have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, dual silicide structures have been employed to reduce contact resistances in semiconductor devices. However, fabricating such dual silicide structures in scaled-down devices involves photolithography operations with narrow patterning windows. This has led to certain challenges to the fabrication of advanced technology nodes. Therefore, although existing dual silicide technologies are generally adequate for their intended purposes, they are not satisfactory in every aspect.

BRIEF DESCRIPTION OF THE DRAWINGS

Aspects of the present disclosure are best understood from the following detailed description when read with the accompanying slides. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
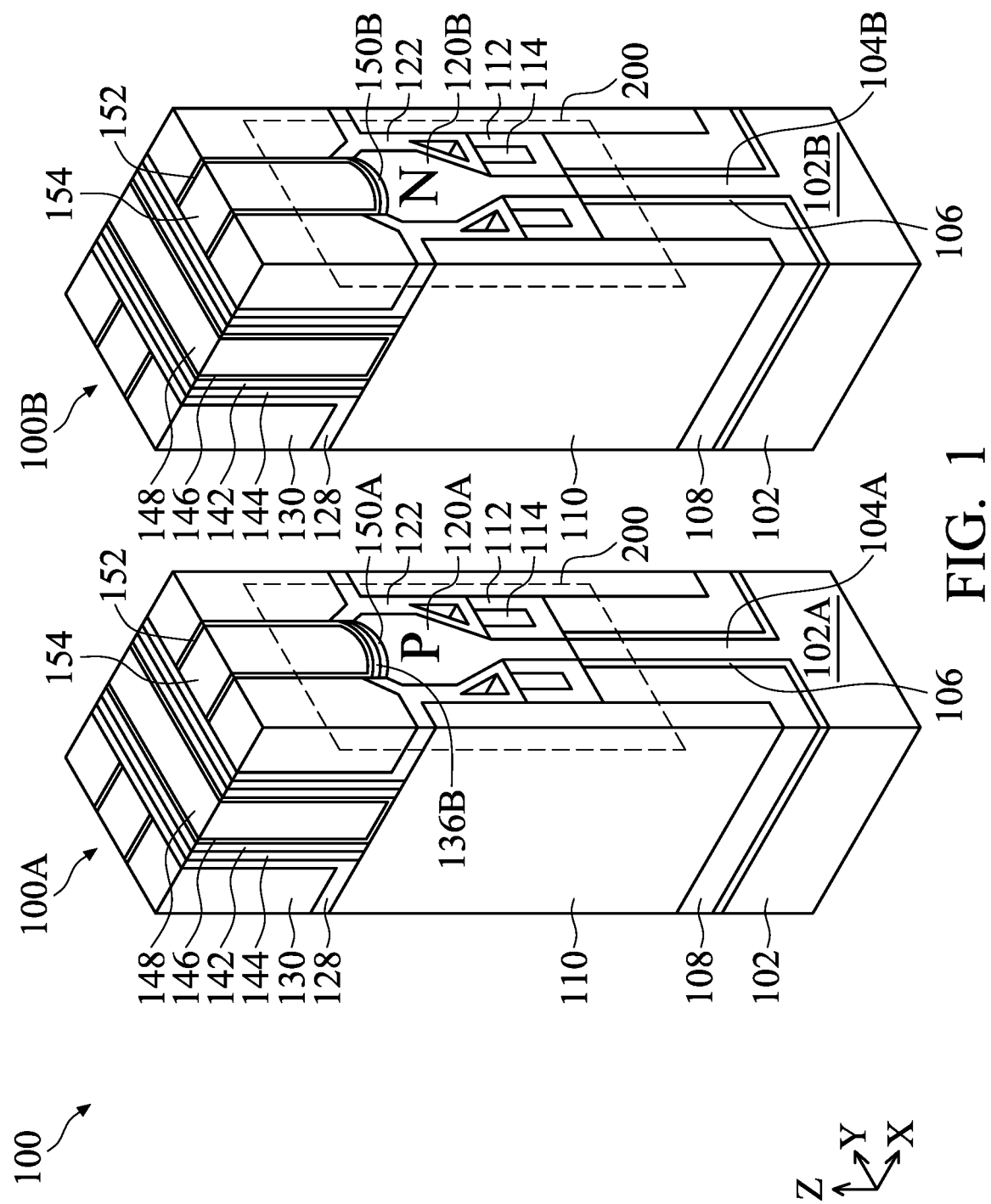
FIG. 1 is a three-dimensional (3D) perspective view of an embodiment of the semiconductor device of the present disclosure according to some embodiments of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices and methods of forming the same. More particularly, the present disclosure is related to ICs and semiconductor devices with dual silicide structures. Dual silicide structures have been commonly employed in ICs and semiconductor devices in order to reduce the contact resistances between contact features and the source/drain features. For example, different work function metals (such as p-type work function metals and n-type work function metals) may be used for p-type transistors and n-type transistors, respectively. These work function metals interact with the respective materials of the source/drain features to form silicide features with different compositions for different types of transistors. As such, the Schottky barrier height is reduced and the contact resistances are accordingly reduced. As ICs and semiconductor devices continue to scale down, however, it has become more and more challenging to form such dual silicide structures using photolithography patterning with hard masks. Accordingly, the present disclosure proposes a self-aligned dual silicide (or dual salicide) method that uses fewer photolithography steps and/or fewer hard mask layers such that some of the aforementioned processing challenges are alleviated.

In the illustrated embodiments, the semiconductor device includes a fin-like field effect transistor (FinFET). However, the disclosure may be used in any appropriate semiconductor devices, such as in metal-oxide semiconductor field effect transistors (MOSFETs), complementary metal-oxide-semiconductor (CMOS) devices, p-type metal-oxide-semiconductor (pMOS) devices, n-type metal-oxide-semiconductor (nMOS) devices, FinFETs, Gate-All-Around (or Multi-Bridge-Channel) MOSFETs such as nanowire devices and nanosheet devices, and other multi-gate FETs. A person of ordinary skill in the art may recognize other examples of semiconductor devices that may benefit from the present disclosure. The semiconductor devices may be fabricated during processing of the IC, or a portion thereof, that may comprise static random-access memory (SRAM) and/or logic circuits, passive components such as resistors, capacitors, and inductors, and active components such as pFETs, nFETs, FinFETs, MOSFETs, CMOS, bipolar transistors, high voltage transistors, high frequency transistors, other memory cells, and combinations thereof.

FIG. 1 illustrates a three-dimensional (3D) perspective view of an embodiment of the semiconductor device 100 of the present disclosure. FIGS. 2-14 are cross-sectional views of an embodiment of the semiconductor device 100 at different stages of processing, according to some embodiments of the present disclosure. FIG. 15 is a process flow of an embodiment of the method for fabricating a semiconductor device according to various aspects of the present disclosure.

Referring to FIG. 1, a semiconductor device 100 according to an embodiment of the present disclosure is illustrated. The semiconductor device 100 includes a p-type device component 100A and an n-type device component 100B. The p-type device component 100A and the n-type device component 100B may be transistors. P-type device component 100A and n-type device component 100B each include a portion of the substrate 102. For example, the p-type device component 100A includes a portion 102A; and the n-type device component 100B includes a portion 102B. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, or combinations thereof. In some embodiments, the substrate 102 extends in an XY plane. In that regard, the XY plane is a plane defined by the X-direction and the Y-direction. The X-direction and the Y-direction are horizontal directions that are perpendicular to each other; and the Z-direction is a direction perpendicular to the XY plane and to the X-direction and the Y-direction.

Various doped regions, such as source/drain regions, may be formed in or on the substrate 102. The doped regions may be doped with n-type dopants, such as carbon (C), phosphorus (P) or arsenic (As), and/or p-type dopants, such as boron (B) and indium (In), depending on design requirements. The doped regions may be formed directly on the substrate 102, in a p-well structure, in an n-well structure, in a dual-well structure, or using a raised structure. In some embodiments, the n-doped regions are formed in or on the portion 102A of the substrate 102, and are configured for a p-type transistor (such as the p-type device component 100A); and the p-doped regions are formed in or on the portion 102B of the substrate 102, and are configured for an n-type transistor (such as the n-type device component 100B). Doped regions may be formed by implantation of dopant atoms, in-situ doped epitaxial growth, and/or other suitable techniques.

In the depicted embodiments, the p-type device component 100A and n-type device component 100B each include three-dimensional active regions 104 on the substrate 102. The active regions 104 are elongated fin-like structures that protrude upwardly out of the substrate 102 (e.g. along the Z-direction). As such, the active regions 104 may be interchangeably referred to as fin active regions 104, fins 104 or fin structures 104 hereinafter. In some embodiments, the fins 104 are oriented lengthwise along the X-direction. In some embodiments, liner layers 106 are formed on sidewall surfaces of the fins 104 and on the substrate 102. The liner layers 106 may include any suitable materials, such as silicon dioxide ($SiO_2$), silicon oxynitride (SiON), silicon nitride (SiN), or combinations thereof. As described above, the semiconductor device 100 may alternatively include components other than FinFETs. Accordingly, the active regions 104A and 104B may be of profiles other than fins.

P-type device component 100A and n-type device component 100B each further include isolation structures 108 over the substrate 102 (and over the liner layers 106, if present). The isolation structures 108 electrically separate various components of the semiconductor device 100 (such as fin structures 104). The isolation structures 108 may include $SiO_2$, SiN, SiON, fluoride-doped silicate glass (FSG), a low-k dielectric material, and/or other suitable materials. In some embodiments, the isolation structures 108 may include shallow trench isolation (STI) features. In one embodiment, the isolation structures 108 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 108. Alternatively, the isolation structures 108 may include a multi-layer structure, for example, having one or more thermal oxide liner layers.

P-type device component 100A and n-type device component 100B each further include an interlayer dielectric (ILD) layer 114 on the isolation structures 108, such that at least a portion of the fin structures 104 are embedded within the ILD layer 114. The ILD layer 114 may include any suitable materials, such as $SiO_2$. In some embodiments, an etching stop layer 112 interposes between the isolation structures 108 and the ILD layer 114. The etching stop layer 112 includes materials different from that of the ILD layer 114, and protects the features beneath the etching stop layer 112 in subsequent etching operations. In some embodiments, the p-type device component 100A and n-type device component 100B each additionally include dielectric fins 110. In some embodiments, the dielectric fins 110 are formed adjacent source/drain features to confine the growth of the epitaxial materials. The dielectric fins 110, in conjunction with other dielectric spacers can be used to produce any desirable size of the epitaxial S/D features, particularly small S/D features for reducing parasitic capacitances. Furthermore, the dielectric fins may provide support to gate structures formed thereover. The dielectric fins 110 may include any suitable materials, such as SiCN, SiOCN, SiON, metal oxides, other suitable materials, or combinations thereof.

P-type device component 100A and n-type device component 100B each also include a gate structures 140 formed over and engaging the fin structures 104 in a channel region of each fin structure 104. In some embodiments, the gate structures 140 are embedded in an ILD layer 130 over the fin structures 104, the dielectric fins 110, and the ILD layer 114, and are oriented lengthwise along the Y-direction, i.e., generally perpendicular to the lengthwise direction of the fins 104. The gate structures 140 may be high-k metal gate (HKMG) structures that contain a high-k gate dielectric 146 and a metal gate electrode 148. The high-k gate dielectric 146 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The gate structures 140 may include gate spacer layers, such as gate spacer layer 142 and/or gate spacer layer 144. In some embodiments, the gate spacer layers 142 and/or 144 includes SiCN, SiOCN, and/or SiON. In some embodiments, the gate spacer layers 142 and/or 144 protect(s) the gate layers (such as gate dielectric layer 146 and the gate electrode layer 148) from damages in subsequent etching operations (as described later). In some embodiments, additional material layers, such as an interfacial layer, a capping layer, other suitable layers, or combinations thereof, are formed over the fins 104. In some embodiments, the gate structures 140 may be dummy gate structures (e.g., containing an oxide gate dielectric and a polysilicon gate electrode).

P-type device component 100A and n-type device component 100B each also include source/drain features 120 formed over the fins 104. For example, p-type device component 100A includes p-type source/drain feature 120A on both sides of the gate structures 140 (such as in or on the source/drain regions); and n-type device component 100B includes n-type source/drain feature 120B on both sides of the gate structures 140 (such as in or on the source/drain regions). In some embodiments, the source/drain features 120 may include epitaxial layers (or epi-layers) that are epitaxially grown on the fin structures 104, and are therefore interchangeably referred to as epitaxial source/drain features 120A and/or 120B. In some embodiments, the source/drain features 120 each include a semiconductor material. For example, p-type source/drain features 120A include silicon germanium (SiGe) and n-type source/drain features 120B include silicon (Si) and/or silicon carbide (SiC). In some embodiments, the p-type source/drain features 120A include germanium (Ge) at a concentration equal to or less than 50% by atomic percentage. In some embodiments, the p-type source/drain features 120A include Ge at a concentration equal to or less than 40% by atomic percentage. As described in more detail below, etch selectivity in a subsequent operation may be achieved based on the concentration of Ge. In some embodiments, the source/drain features 120 may include a dopant. For example, p-type source/drain features 120A include p-type dopants, such as B and/or In; and n-type source/drain features 120B include n-type dopants, such as C, P, and/or As.

P-type device component 100A and n-type device component 100B each also include contact features 154 formed over the p-type source/drain features 120A and over the n-type source/drain features 120B. The contact features 154 may include any suitable metal materials, such as tungsten (W), cobalt (Co), aluminum (Al), copper (Cu), or combinations thereof. In some embodiments, a glue layer 152 is formed between the contact features 154 and the ILD layer 130, and between the contact features 154 and the p-type and n-type source/drain features. In some embodiments, the glue layer 152 is a conformal layer and has a thickness of about 3 nm to about 5 nm. If the thickness is too small, such as less than 3 nm, the efficacy of the glue layer 152 may be limited; while if the thickness is too large, such as greater than 5 nm, the glue layer may unnecessarily take up valuable spaces for the contact feature, which otherwise could have a greater size and lower resistance. The glue layer may include any suitable glue layer material, such as titanium nitride (TiN), tantalum nitride (TaN), tungsten nitride (WN), titanium silicon nitride (TiSiN), and/or tantalum silicon nitride (TaSiN).

P-type device component 100A and n-type device component 100B each include a silicide layer over the respective source/drain features 120A and 120B, respectively. In other words, the semiconductor device 100 has a dual silicide structure. For example, the p-type device component 100A includes a silicide layer 150A between the p-type source/drain feature 120A and the contact feature 154 (or the glue layer 152, if present); and the n-type device component 100B includes a silicide layer 150B between the n-type source/drain feature 120B and the contact feature 154 (or the glue layer 152, if present). As described in detail later, the silicide 150A is formed from the p-type source/drain feature 120A and a p-type work function metal material. Accordingly, the silicide 150A includes at least one element of the p-type source/drain feature and at least one element of the p-type work function metal material. Moreover, the silicide 150B is formed from the n-type source/drain feature 120B and an n-type work function metal material. Accordingly, the silicide 150B includes at least one element of the n-type source/drain feature and at least one element of the n-type work function metal material.

P-type device component 100A further includes a metal layer 136B interposing between the contact feature 154 (or the glue layer 152, if present) and the silicide 150A. For example, the metal layer 136B may directly interface with the glue layer 152 on its top surface, and directly interface with the silicide layer 150A on its bottom surface. In some embodiments, the metal layer 136B includes an n-type work function metal material. For example, the metal layer 136B may include an n-type work function metal material that is also included in the silicide layer 150B. In some embodiments, no similar metal layer 136B interposes between the glue layer 152 and the silicide 150B. In other words, the glue layer 152 directly interfaces with the silicide 150B. In some other embodiments, the n-type device component 100B also includes the metal layer 136B between the contact feature 154 and the silicide 150B. However, as described in more detail below, the metal layer 136B over the silicide 150B may be thinner (such as along the Z-direction) than the metal layer 136B over the silicide 150A. In some embodiments, p-type device component 100A and n-type device component 100B each include additional features such as etching stop layer 112, hard mask layer(s) disposed over the gate structures 140 (not shown), and numerous other features.

FIGS. 2-13 illustrate the fabrication process for the semiconductor device 100 of FIG. 1 according to an embodiment of the present disclosure. Particularly, FIGS. 2-13 illustrate cross-sectional views (e.g. along a YZ plane identified as "X-cut" in FIG. 1) of the semiconductor device 100 at different processing stages.

Figure 2:
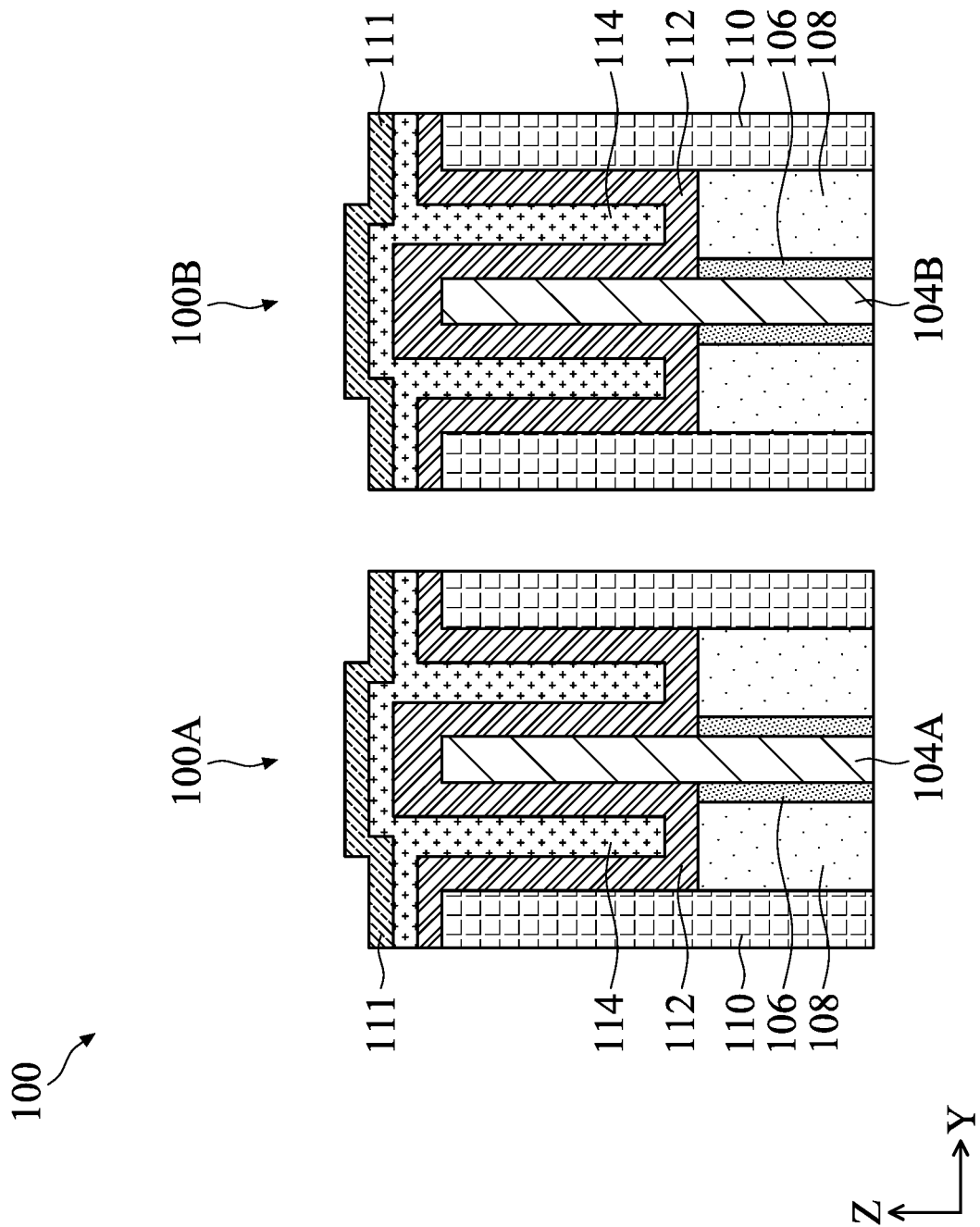
FIGS. 2, 3, 4, 5, 6, 7, 8, 9, 10, 11, 12, 13, and 14 are cross-sectional views of an embodiment of the semiconductor device of the present disclosure, at different stages of processing, according to some embodiments of the present disclosure.

Referring to FIG. 2 and block 202 of FIG. 15, an initial structure for the semiconductor device 100 (for example, including device component 100A and device component 100B) is received. The initial structure includes fin structures 104A for the device component 100A and fin structures 104B for the device component 100B, both embedded in and protruding out from the isolation structures 108. The fin structures 104A and 104B and the isolation structures 108 may be fabricated using suitable processes including photolithography and etching processes. For example, a patterned mask is formed by lithography; the substrate 102 is etched through the openings of the patterned mask to form trenches; the trenches are filled with one or more dielectric material; and a CMP process is conducted to form the isolation structure 108. The isolation structures 108 define the active regions. In the depicted embodiments, the active regions are three-dimensional, such as fin structures 104. Those FETs formed on those fin structures are referred to FinFETs accordingly. In some embodiments, the fin structures 104A and 104B extrude above the isolation structures 108. In some embodiments, the fin structures 104A and 104B may be formed by selective etching to recess the isolation structures 108. In other embodiments, the fin structures 104 may be formed by selective epitaxial growth to the active regions with one or more semiconductor material. In yet some embodiments, the fin structures 104A and 104B may be formed by a hybrid procedure having both selective etching to recess and selective epitaxial growth. In yet some embodiments, the fin structures 104A and 104B are formed by patterning the substrate 102 and then the isolation structures 108 are formed by deposition and CMP. The fin structures 104 may have elongated shape oriented along the X direction. The epitaxial grown semiconductor material may include silicon, germanium, silicon germanium, silicon carbide or other suitable semiconductor material. The selective etching process may include wet etching, dry etching, other suitable etching or a combination thereof.

In some embodiments, the fin structures 104A and 104B may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 104A and 104B.

In some embodiments, doped wells are formed on the active regions (such as the fin structures 104A and 104B). The doped well extends through the active region along the X direction, such as from the left isolation structure 108 to the right isolation structure 108 so that the fin structures 104A and 104B are enclosed within the corresponding doped well. The doped well is formed by ion implantation or other suitable technique. In some examples, the doped well is n-type doped for one or more p-type field effect transistor (FET) to be formed thereon. In some examples, the doped well is p-type doped for one or more n-type FET to be formed thereon. In the depicted embodiment, the semiconductor device 100 includes a p-type doped well and an n-type doped well. In some embodiments, p-type device component 100A is formed on the n-type doped well; and n-type device component 100B is formed on the p-type doped well.

The initial structure of the semiconductor device 100 further includes one or more gate stack, such as gate structures 140 on the substrate 102. Gate structures 140 are formed behind the X-Z cross section of FIG. 2. Accordingly, gate structures 140 are not illustrated by FIG. 2. In some embodiments, the gate structures 140 may be functional metal gate stacks. In some other embodiments, the gate structures 140 may be dummy gate stacks and will be replaced by metal gate stacks at later stages. The formation of the gate stacks includes forming various gate material layers (such as thermal oxidation to form silicon oxide and depositing polysilicon), and patterning the gate material layers using lithography process and etching. A hard mask may be used to pattern the gate material layers. In some embodiments, the initial structure of the semiconductor device 100 also includes dielectric fins 110, ILD layer 114, and/or etching stop layer 112.

Figure 3:
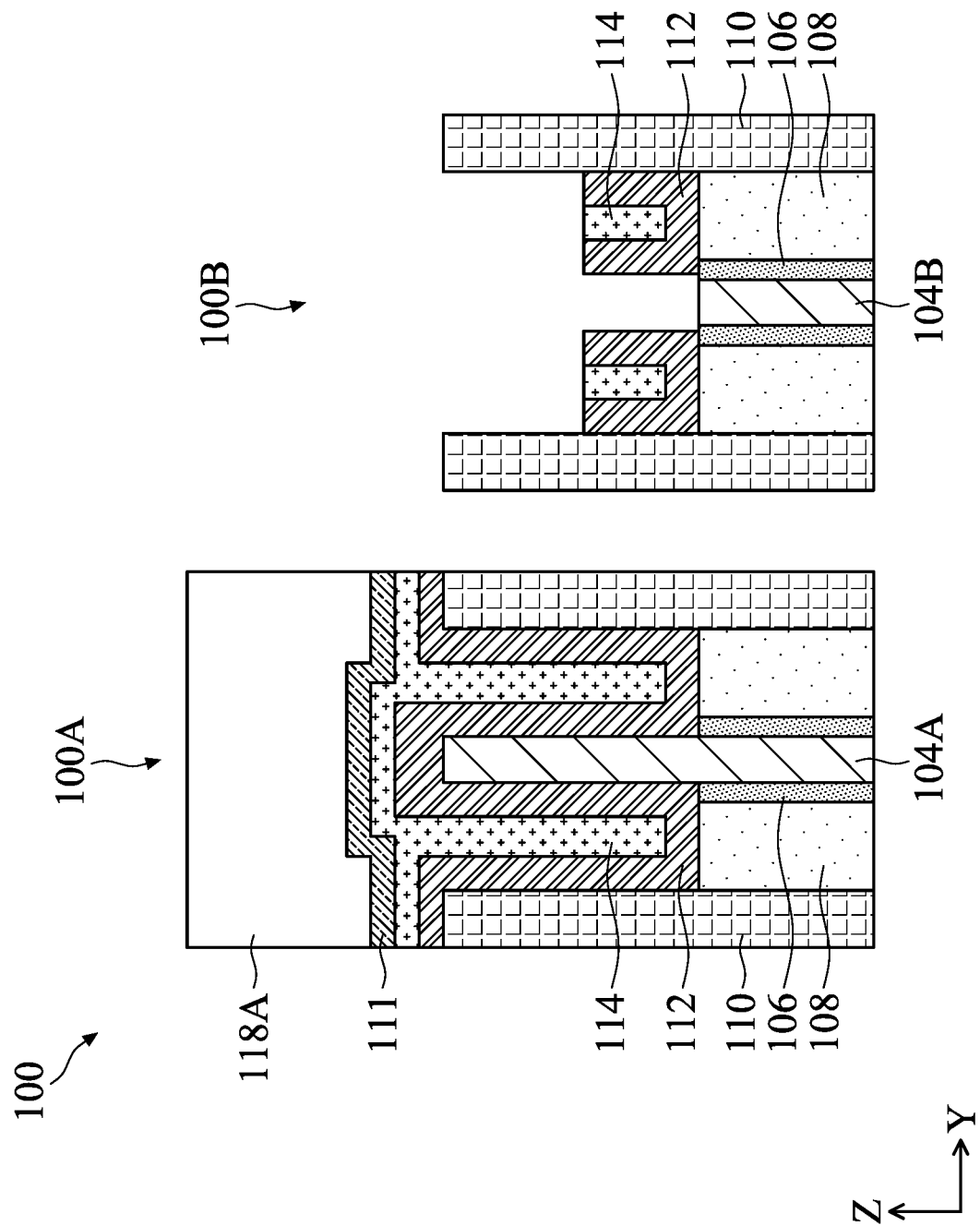

The method proceeds to form source/drain features 120B of the n-type semiconductor device component 100B over the substrate portion 102B. Referring to FIG. 3, a patterned photoresist layer 118A is formed to cover at least the p-type device component 100A while exposing at least the source/drain regions of the n-type semiconductor device component 100B. A source/drain region refers to an area of a fin structure for the corresponding source/drain feature to be formed thereon. The source/drain regions are also exposed by the gate structures 140. The patterned photoresist layer 118A may be formed by lithography process that includes photoresist coating, exposure to ultraviolet (UV) radiation, and developing process. A hard mask, such as silicon nitride, or other suitable material, may be further used. In this case, the openings of the patterned photoresist layer 118A is first transferred to the hard mask by etch. Then, an etching process, such as dry etching, wet etching or a combination thereof, is conducted to remove the exposed portions of the fin structures 104B in the source/drain regions of the n-type semiconductor device component 100B. The etching process may include one or more etching step that opens the liner layer 106 and recesses the source/drain regions. Especially, the etching process recesses the exposed source/drain regions to form source/drain trenches.

Figure 4:
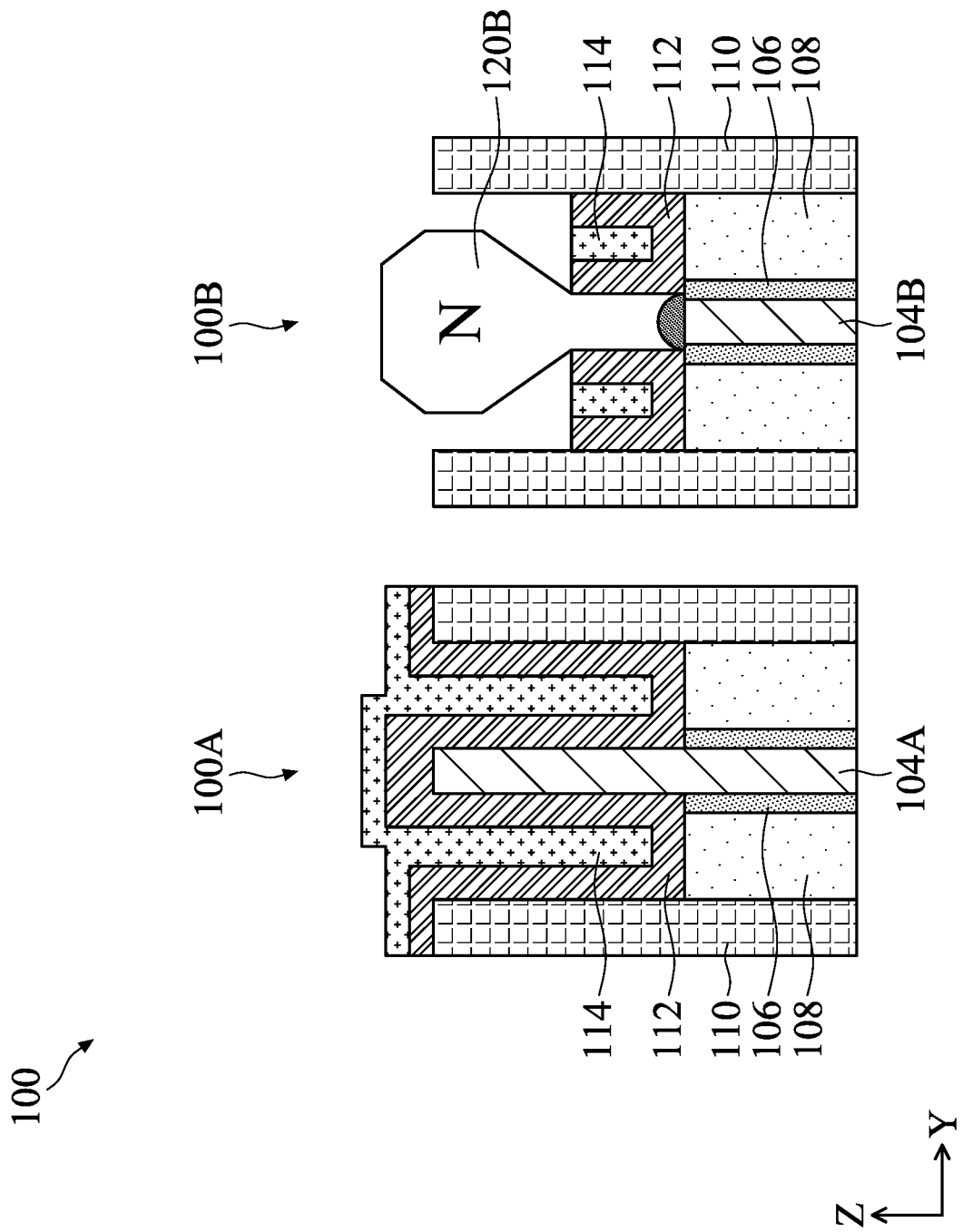

Subsequently, referring to FIG. 4 and block 204A of FIG. 15, an epitaxial process is performed to form source/drain features 120B on the substrate portion 102B. During the epitaxial process, the gate structures 140 and/or the patterned photoresist layer 118 limit the source/drain features 120B to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which interact with the composition of the n-type device component 100B. In some embodiments, the source/drain features 120B includes silicon (Si), and the precursor for the epitaxial process includes Si. The source/drain features 120B may be in-situ doped during the epitaxial process by introducing doping species including n-type dopants, such as phosphorus or arsenic; and/or other suitable dopants including combinations thereof. If the source/drain features 120B are not in-situ doped, an implantation process (i.e., a junction implant process) is performed to dope the source/drain features 120B. In an exemplary embodiment, the source/drain features 120B include SiP. One or more annealing processes may be performed to activate the source/drain features 120B. Suitable annealing processes include rapid thermal annealing (RTA) and/or laser annealing processes. Moreover, the patterned photoresist layer 118A (or the hard mask) is removed, such that the ILD layer 114 is exposed in the p-type device region.

Figure 5:
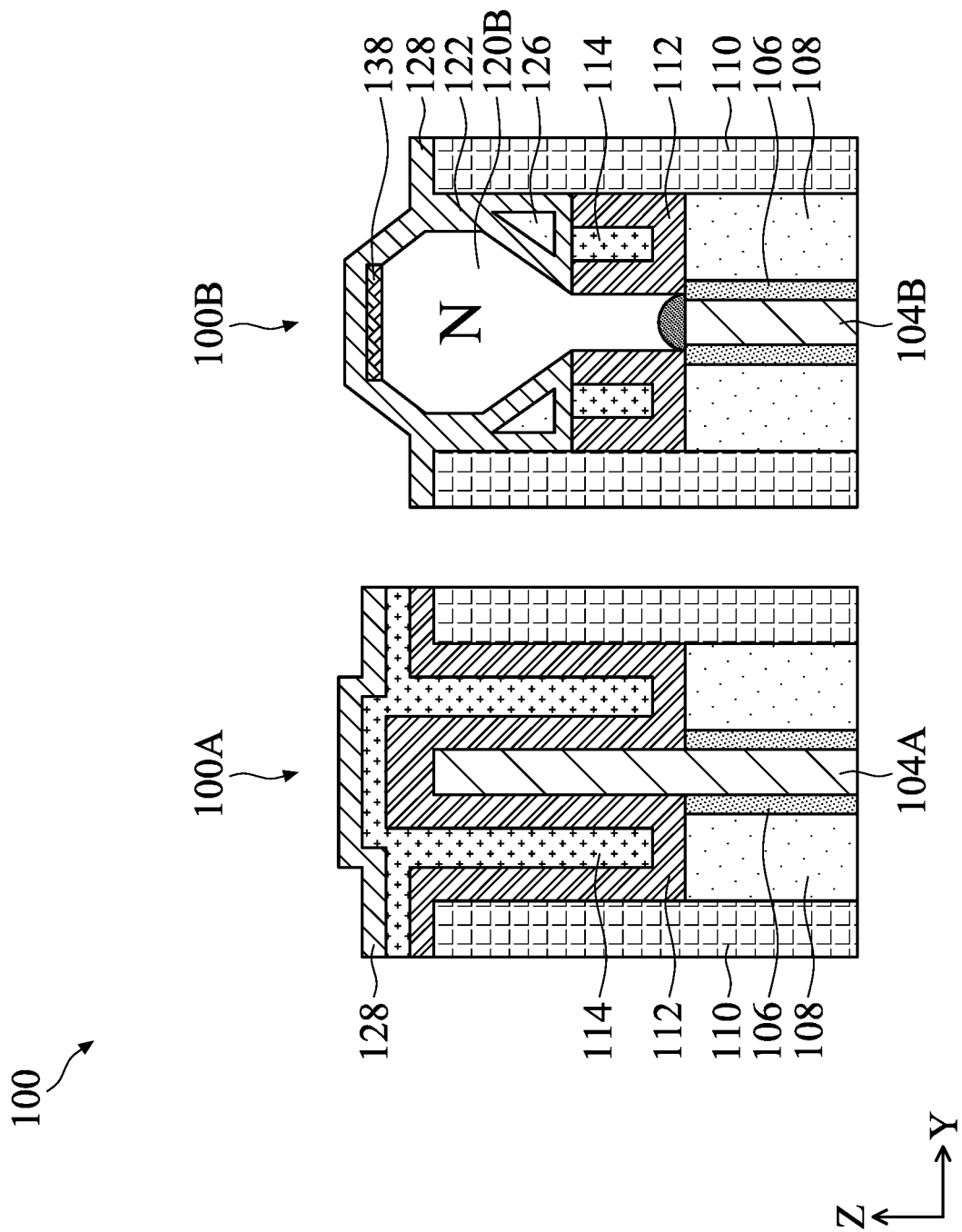

Referring to FIG. 5 and block 204B of FIG. 15, after the formation of the source/drain features 120B, a capping layer 138 is formed over (for example, directly contacting) the source/drain features 120B. In some embodiments, the capping layer 138 may be formed using an epitaxial process similar to that described above. This second epitaxial process differs in that the precursor to this process includes germanium (Ge). For example, the capping layer 138 may be a silicon germanium (SiGe) layer. Accordingly, the precursor may implement a gas that includes Si and a gas that includes Ge. In some embodiments, the capping layer 138 is formed in the same tool as the n-type source/drain features 120B. In some embodiments, the capping layer 138 is formed immediately following the formation of the source/drain features 120B, for example, without breaking the vacuum of the tool. In some embodiments, forming the capping layer 138 following the formation of the n-type epitaxial source/drain feature and before the start of the formation of the p-type epitaxial source/drain features enables forming self-aligned dual silicide structures without additional use of lithography operations and/or hard masks. This alleviates the challenge in achieving the necessary resolution associated with the repeated use of hard masks of conventional technologies and reduces the fabrication cost.

In some embodiments, the Ge concentration in the capping layer 138 may be adjusted by tuning the flow rate of the gas including the Ge relative to the flow rate of the gas including the Si. As described in more detail below, in some embodiments, the process parameters are configured to form the capping layer 138 having a Ge concentration greater than 60% by atomic percentage. In some embodiments, the capping layer 138 includes Ge at a concentration greater than 70% by atomic percentage. In some embodiments, the capping layer 138 is not doped. In some embodiments, the capping layer 138 directly contacts the exposed top surface of the n-type source/drain feature 120B.

Still referring to FIG. 5, an etch-stop layer 128 is formed over the exposed surfaces of the capping layer 138 and the top surface of the p-type device component 100A. In some embodiments, the etch-stop layer 128 further covers the exposed surfaces of the dielectric fins 110 and the ILD layer 114 in the n-type device region. In some embodiments, the etch-stop layer 128 wraps around the source/drain features 120B. In some embodiments, the etch-stop layer 128 protects the source/drain features 120B from unintended damages during subsequent operations. The etch-stop layer 128 may include any suitable etch-stop materials, such as SiN and/or SiCN. In some embodiments, the etch-stop layer 128 has a thickness of about 5 nm to about 10 nm. If the thickness is too small, such as less than 5 nm, its efficacy in protecting the source/drain features 120B may be limited. If the thickness is too large, such as greater than 10 nm, it may unnecessarily take up valuable space that may be otherwise used by other important features of the semiconductor device 100. In some embodiments, the etch-stop layer 128 is a conformal layer. Moreover, in some embodiments, a separation between the source/drain features 120B and the adjacent dielectric fin 110 may be less than twice of the thickness of the etching stop layer 128. Accordingly, the etch-stop layer 128 merges. In some embodiments, the merging etching stop layer 128 encloses voids 126 in a region defined by the dielectric fins 110, the source/drain features 120A or 120B, and the ILD layer 114.

Figure 6:
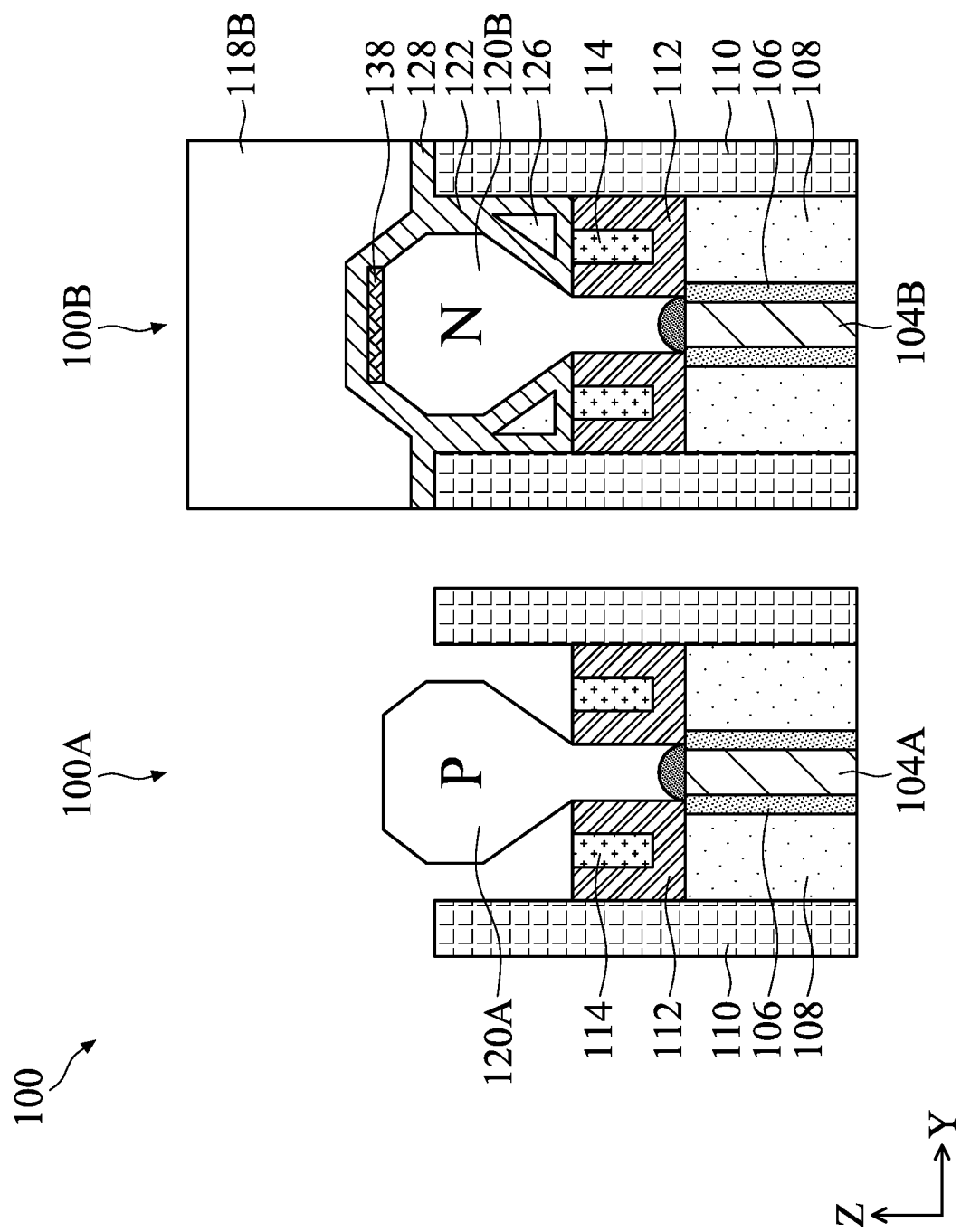

Referring to FIG. 6 and block 204C of FIG. 15, another patterned photoresist layer 118B is formed over the n-type device component 100B. In some embodiments, the patterned photoresist layer is similar to the patterned photoresist layer 118A. The patterned photoresist layer 118B covers the n-type device component 100B while exposing at least a source/drain region of the p-type device component. In some embodiments, a hard mask layer is used instead. A dry etching process is conducted to remove the exposed portions of the fin structures 104A over the substrate portion 102A. Accordingly, source/drain trenches are formed over the fin structure 104A for the p-type device component 100A. Subsequently, an epitaxial process is performed to form source/drain features 120A. This epitaxial process generally resembles the previous epitaxial processes. In some embodiments, the epitaxial process implements a Si-containing precursor and a Ge-containing precursor, so as to form the epitaxial source/drain features 120A of SiGe. In some embodiments, the p-type source/drain features 120A may be in-situ doped with a p-type dopant during the epitaxial process, such as boron (B) or boron fluoride (BF2); and/or other suitable dopants including combinations thereof. If the source/drain features 120A are not in-situ doped, an implantation process (i.e., a junction implant process) is performed to dope the source/drain features 120A. In an exemplary embodiment, the source/drain features 120A include SiGeB. One or more annealing processes may be performed to activate the source/drain features 120A, similar to those described above with respect to the source/drain features 120B.

In some embodiments, the flow rates of the Si-containing precursor and the Ge-containing precursor are adjusted to form a SiGe epitaxial layer (or the p-type source/drain feature 120A) having Ge at a concentration less than 50% by atomic percentage. Accordingly, the capping layer 138 has Ge at a concentration that is greater than the p-type source/drain features 120A. For example, a ratio of the Ge concentration in the capping layer 138 to the Ge concentration in the p-type source/drain feature is greater than 6:5. In other words, the Ge concentration in the capping layer 138 is at least 20% (by atomic percentage) greater than the Ge concentration in the p-type source/drain feature. As described in more detail below, this difference in Ge concentration may lead to different etch selectivity, such that a layer derived from the capping layer 138 may be removed in an etching operation while a layer derived from the p-type source/drain feature 120A (such as a silicide layer) may be substantially preserved. If the ratio is too low, such as lower than 6:5, the desired etching selectivity may not be achieved, and the integrity of the layer over the p-type source/drain features (such as the silicide layer) may be compromised.

In some embodiments, the flow rates are adjusted to form source/drain features 120A having SiGe layers with a Ge concentration less than 40% by atomic percentage, while to form the capping layer 138 having a Ge concentration greater than 70% by atomic percentage. Accordingly, a ratio of the Ge concentration in the capping layer 138 to the Ge concentration in the p-type source/drain feature is greater than 7:4. In other words, the Ge concentration in the capping layer 138 is at least 75% greater than the Ge concentration in the p-type source/drain feature 120A. The even greater difference in the Ge concentrations allows for even better etching selectivity in subsequent operations. For example, such increased etching selectivity may be required when the selection of etching condition (such as etching chemicals) is limited due to various device and/or design restrictions.

Figure 7:
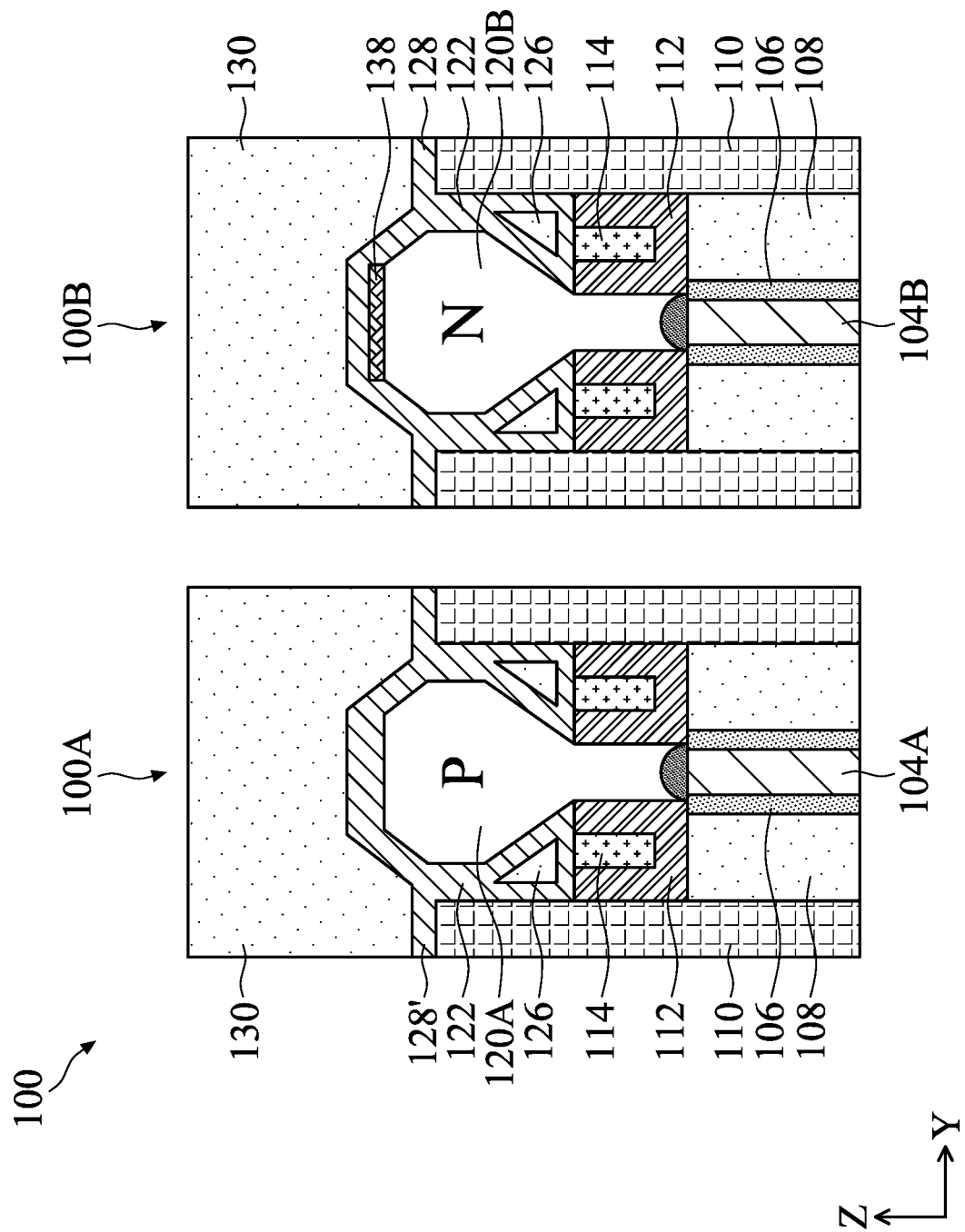

After forming the p-type epitaxial source/drain features 120A, the photoresist layer 118B is removed. Referring to FIG. 7, an etch-stop layer 128' is formed over the exposed surfaces of the p-type source/drain features 120A. The etch-stop layer 128' may be similar to the etch-stop layer 128 described above. For example, the etch-stop layer 128' may wrap around the epitaxial source/drain features 120A. In some embodiments, the etch-stop layer 128' also merges and encloses a void 126. At this processing stage, still referring to FIG. 7 and further referring to block 206 of FIG. 15, an ILD layer 130 is formed over the dielectric fins 110 and over the etch-stop layers 128 and 128'. The ILD layer 130 may include any suitable dielectric material, such as silicon dioxide.

Figure 8:
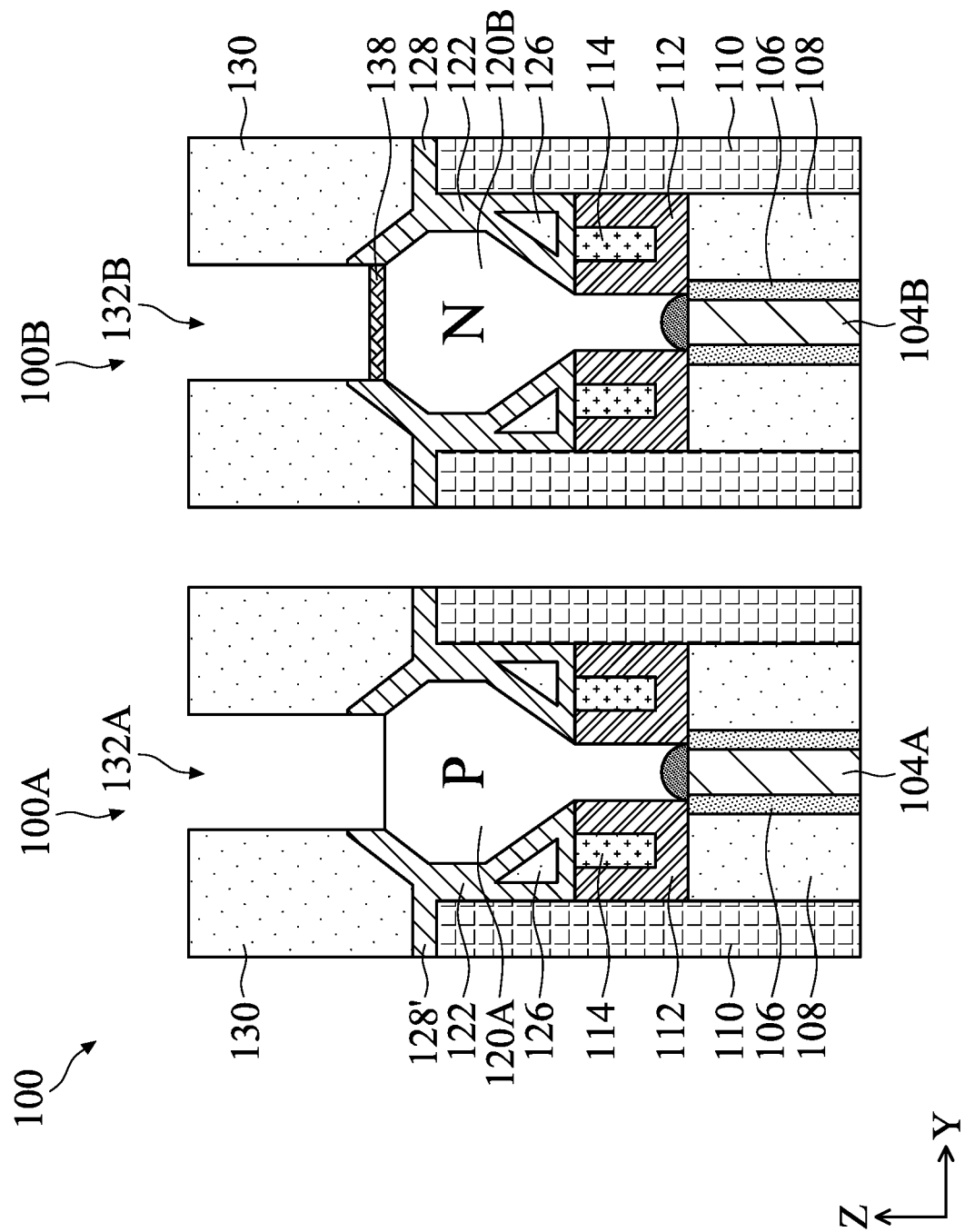

Referring to FIG. 8 and block 208 of FIG. 15, an etching process is utilized to form trenches 132A in the ILD layer 130 over the p-type source/drain features 120A and trenches 132B in the ILD layer 130 over the n-type source/drain features 120B. As described above, the p-type source/drain features 120A and the n-type source/drain features 120B may be wrapped by the etch-stop layer 128' and 128, respectively. Accordingly, the etching process may be configured to etch through the etch-stop layers 128' and 128 to expose the top surfaces of the p-type source/drain features 120A and the top surface of the capping layer 138. In some embodiments, the etching process terminates when the p-type source/drain features 120A are exposed (for example, when the SiGe material of the p-type source/drain feature is exposed) or when the capping layer 138 is exposed (for example, when the SiGe material of the capping layer 138 is exposed). In other words, the etching process may stop when the etching chemical reaches the Ge material component. Any suitable methods may be used for the etching process.

As described above, the etching process exposes the top surfaces of the p-type source/drain feature 120A and the capping layer 138 over the n-type source/drain features 120B. Accordingly, the p-type source/drain features 120A defines bottom surfaces of the trenches 132A, and the capping layer 138 defines bottom surfaces of the trenches 132B. Moreover, trenches 132A and 132B have sidewall surfaces defined by the remaining portions of the ILD layer 130 and the remaining portions of the etch-stop layers 128 and 128'. In other words, sidewalls of the trenches 132A and/or 132B are at least partially defined by the remaining portions of the etch-stop layers 128' and/or 128. Moreover, the etch-stop layers 128' and/or 128 have sidewall surfaces exposed in the trenches 132A and/or 132B.

Figure 9:
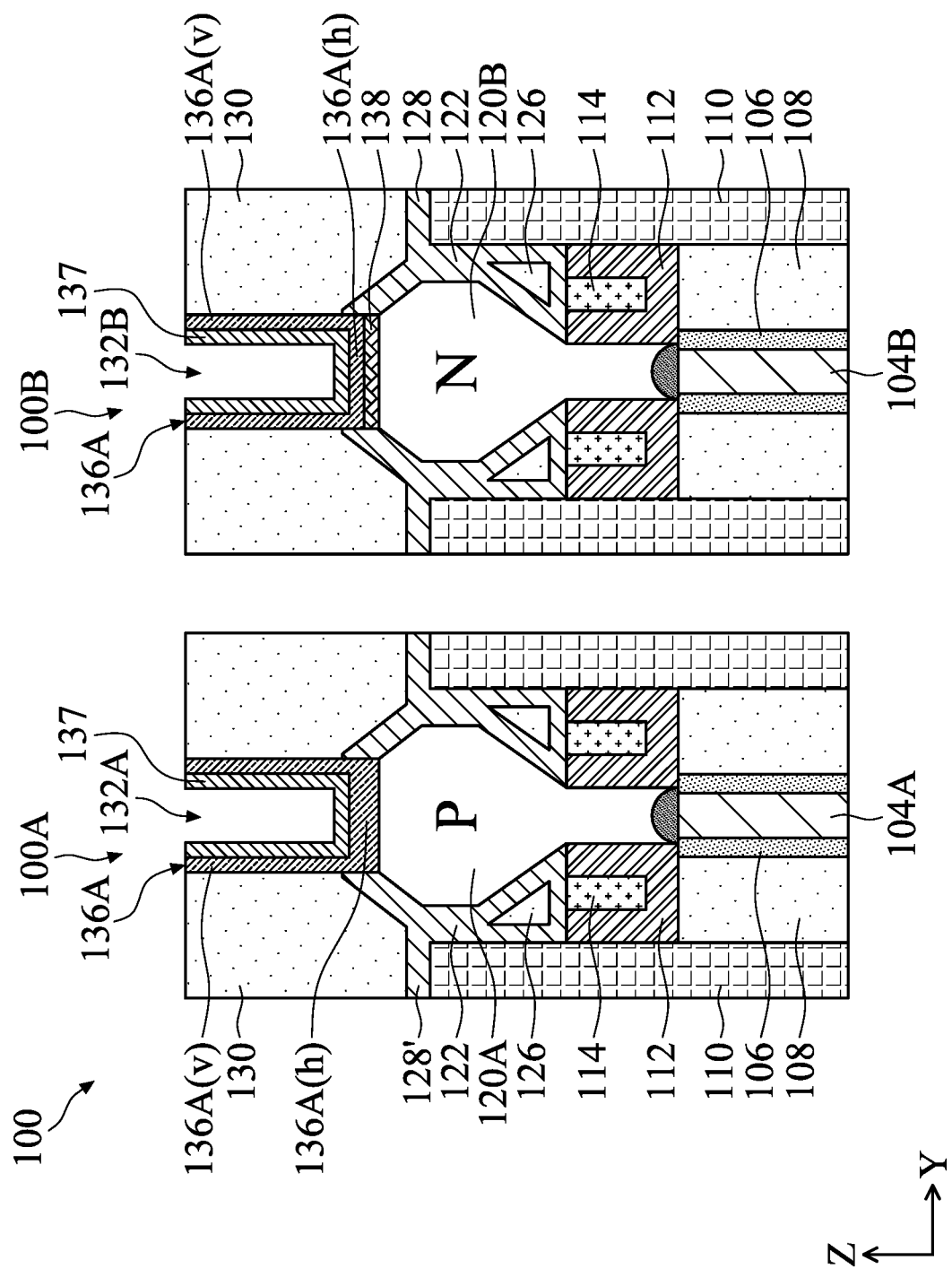

Referring to FIG. 9 and block 210 of FIG. 15, a metal layer 136A is formed over the p-type source/drain features 120A in the trenches 132A and over the n-type source/drain features 120B in the trenches 132B, respectively. In some embodiments, the metal layer 136A directly contacts the p-type source/drain features 120A, and directly contacts the capping layer 138 over the n-type source/drain features 120B. In other words, the metal layer 136A does not directly contact (or interface with) n-type source/drain features 120B. In some embodiments, the metal layer 136A includes a p-type work function metal. P-type work function metals are metals that have work function values (e.g. amount of energy to remove an electron from the metal) greater (or more positive) than the Fermi level of the semiconductor. In some embodiments, the metal layer 136A includes nickel (Ni), platinum (Pt), palladium (Pd), vanadium (V), ruthenium (Ru), tantalum (Ta), titanium nitride, titanium silicon nitride, tantalum nitride, tungsten carbonitride, tungsten nitride, molybdenum (Mo), other suitable metal, or combinations thereof. The metal layer 136A may include a plurality of layers and may be deposited by ALD, CVD, PVD, and/or other suitable process. In some embodiments, the work function metal of the metal layer 136A (in conjunction with other metal layers) is configured to tune a work function of the semiconductor device components 100A and 100B, and thereby controlling threshold voltages of the semiconductor device components 100A and 100B.

In some embodiments, the metal layer 136A is formed to directly contact the sidewalls of the trenches 132A and 132B. Accordingly, the metal layer 136A directly contacts the exposed sidewall surfaces of the remaining portions of the ILD layer 130, and directly contacts the exposed sidewall surfaces of the remaining portions of the etch-stop layers 128' and 128. In some embodiments, the metal layer 136A is a conformal layer and partially fills the trenches 132A and 132B such that a width and depth of the trenches 132A and 132B are reduced. In some embodiments, the metal layer 136A has a thickness of about 5 nm to about 10 nm. If the thickness is too small, such as less than 5 nm, thermal agglomeration and/or discontinuous islanding may cause subsequently formed silicide layers to be non-uniform, thereby having reduced efficacy with respect to reducing contact resistances. If the thickness is too large, such as greater than 10 nm, it may unnecessarily take up valuable space that may be otherwise used by other important features of the semiconductor device 100. In some embodiments, the metal layer 136A includes two vertical portions 136A(v) connected by a horizontal portion 136A(h). The horizontal portion 136A(h) extends from a sidewall surface of the etch-stop layer 128' or 128 to an opposing sidewall surface of the etch-stop layer 128' or 128.

In some embodiments, a protective layer 137 is formed over the metal layer 136A in the trenches 132A and 132B. In some embodiments, the protective layer 137 protects the metal layer 136A from being compromised in subsequent processes, such as from oxidation in subsequent heating treatments. In some embodiments, the protective layer 137 may include titanium nitride, tantalum nitride, any other suitable protective material, or combinations thereof. In some embodiments, the protective layer 137 may be a conformal layer and has a thickness of about 3 nm to about 5 nm. If the thickness is too small, such as less than 3 nm, its efficacy in protecting the metal layer 136A may be limited. If the thickness is too large, such as larger than 5 nm, it may unnecessarily take up valuable space that may be otherwise used by other important features of the semiconductor device 100. The protective layer 137 partially fills the trenches 132A and 132B such that widths and depths of the trenches 132A and 132B are reduced.

Figure 10:
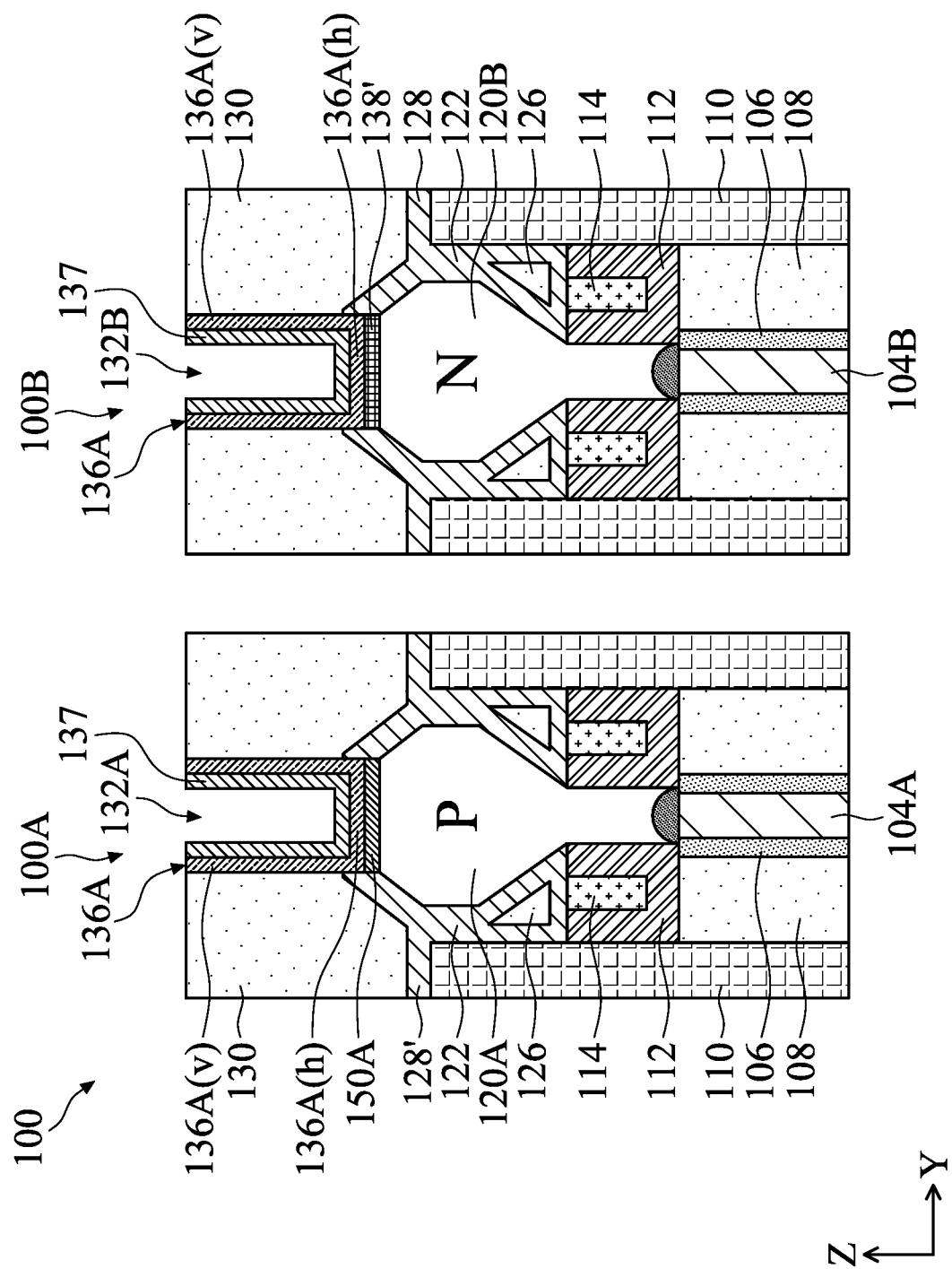

Referring now to FIG. 10 and block 212 of FIG. 15, the semiconductor device 100 is subject to a heating treatment, such as an annealing treatment. In some embodiments, the heating treatment includes annealing the semiconductor device 100 at a temperature of about 300° C. to about 400° C. In some embodiments, the composition of the ambient gas, the composition of the purge gas, the flow rates of the ambient gas, the flow rate of the purge gas, the gas pressure in the chamber, as well as the temperature ramp-up rate, the temperature hold time, and the temperature range may all be adjusted in order to facilitate the chemical reaction that forms a silicide layer over the p-type source/drain features 120A. Accordingly, the heating treatment induces a chemical reaction between the p-type source/drain feature 120A and the metal layer 136A. For example, the p-type source/drain feature includes SiGe. The p-type work function metal of the metal layer 136A reacts with the SiGe to form silicide layer 150A. Therefore, the silicide layer 150A includes at least Ge from the SiGe of the p-type source/drain feature 120A and the p-type work function metal from the metal layer 136A. As a result, a thickness of the p-type source/drain feature 120A (such as along the Z-direction) is reduced, and a thickness of the metal layer 136A is reduced, as compared to before the heating treatment (see FIG. 6). In some embodiments, at least a bottom portion of the metal layer 136A in the trench 132A that interfaces with the p-type source/drain feature 120A is consumed to form the silicide layer 150A. In some embodiments, the entirety of the horizontal portion 136A(h) of the metal layer 136A in the trench 132A is consumed. Accordingly, the silicide layer 150A directly contacts and interfaces with the protective layer 137. However, in some embodiments (as illustrated in FIG. 10), only a bottom region of the horizontal portion 136A(h) of the metal layer 136A in the trench 132A is consumed. Accordingly, an upper region of the horizontal portion 136A(h) covers the top surface of the formed silicide layer 150A. Moreover, in this scenario, the vertical portions 136A(v) remain connected by the upper region of the horizontal portion 136A(h), such that the metal layer 136A remains as a continuous layer on the illustrated cross section. In some embodiments, the metal layer 136A was deposited as a non-conformal layer where the horizontal portion 136A(h) has a thickness greater than the vertical portions 136A(v). The annealing treatment causes the thickness of the horizontal portion 136A(h) to be reduced and approaching the thickness of the vertical portions 136A(v). In other embodiments, the metal layer 136 was deposited as a conformal layer. Accordingly, after the heating treatment, the horizontal portion 136A(h) has a thickness less than the vertical portions 136A(v), and is no longer conformal.

In some embodiments, the silicide layer 150A includes nickel silicon (NiSi), nickel platinum silicon (NiPtSi), other silicide materials, or combinations thereof. In some embodiments, the silicide layer 150A has a thickness of about 5 nm to about 10 nm. If the silicide layer thickness is too small, for example, less than 5 nm, the silicide layer may have limited efficacy in reducing the contact resistances. Furthermore, the silicide may become non-uniform where thermal agglomeration and discontinuous islanding occur. If the silicide layer thickness is too large, such as greater than 10 nm, a large portion of the source/drain material is consumed and may cause issues such as reduced speeds and leakages.

Moreover, the heating treatment further induces a chemical reaction between the capping layer 138 and the p-type work function metal of the metal layer 136A in the trench 132B. As described above, the capping layer 138 may include SiGe. Accordingly, at least an upper portion the capping layer 138 that interfaces with the metal layer 136A is converted into capping layer 138'. In other words, the capping layer 138' includes at least Ge from the SiGe of the capping layer 138 and the p-type work function metal from the metal layer 136A. As a result, a thickness of the capping layer 138 (such as along the Z-direction) is reduced, and a thickness of the metal layer 136A is reduced. In some embodiments, the entirety of the capping layer 138 is converted into the capping layer 138', such that the thickness of the capping layer 138 is reduced to zero. Accordingly, the capping layer 138' directly interfaces with the n-type source/drain feature 120B. Meanwhile, at least a bottom portion of the metal layer 136A in the trench 132B that interfaces with the capping layer 138 is consumed to form the capping layer 138'. In some embodiments, the entirety of the horizontal portion 136A(h) of the metal layer 136A in the trench 132B is consumed. However, in some embodiments (as illustrated in FIG. 10), only a bottom region of the horizontal portion 136A(h) of the metal layer 136A in the trench 132B is consumed. Accordingly, an upper region of the horizontal portion 136A(h) covers the top surface of the formed capping layer 138'. Moreover, in this scenario, the vertical portions 136A(v) are connected by the upper region of the horizontal portion 136A(h), such that the metal layer 136A remains as a continuous layer on the illustrated cross section. In some embodiments, the metal layer 136A was deposited as a non-conformal layer where the horizontal portion 136A(h) has a thickness greater than the vertical portions 136A(v). The annealing treatment causes the thickness of the horizontal portion 136A(h) to be reduced and approaching the thickness of the vertical portions 136A(v). In other embodiments, the metal layer 136 was deposited as a conformal layer. Accordingly, after the heating treatment, the horizontal portion 136A(h) has a thickness less than the vertical portions 136A(v), and no longer conformal.

As described above, both the silicide layer 150A in the trench 132A and the capping layer 138' in the trench 132B include Ge and the p-type work function metal. However, the silicide layer 150A is formed from a layer having a higher Ge concentration (such as from the p-type source/drain features 120A); while the capping layer 138' is formed from a layer having a lower Ge concentration (such as from the capping layer 138). Accordingly, the silicide layer 150A has a higher Ge concentration than the capping layer 138' does. This Ge concentration difference leads to an etching rate difference in certain etching chemicals in subsequent processes.

Figure 11:
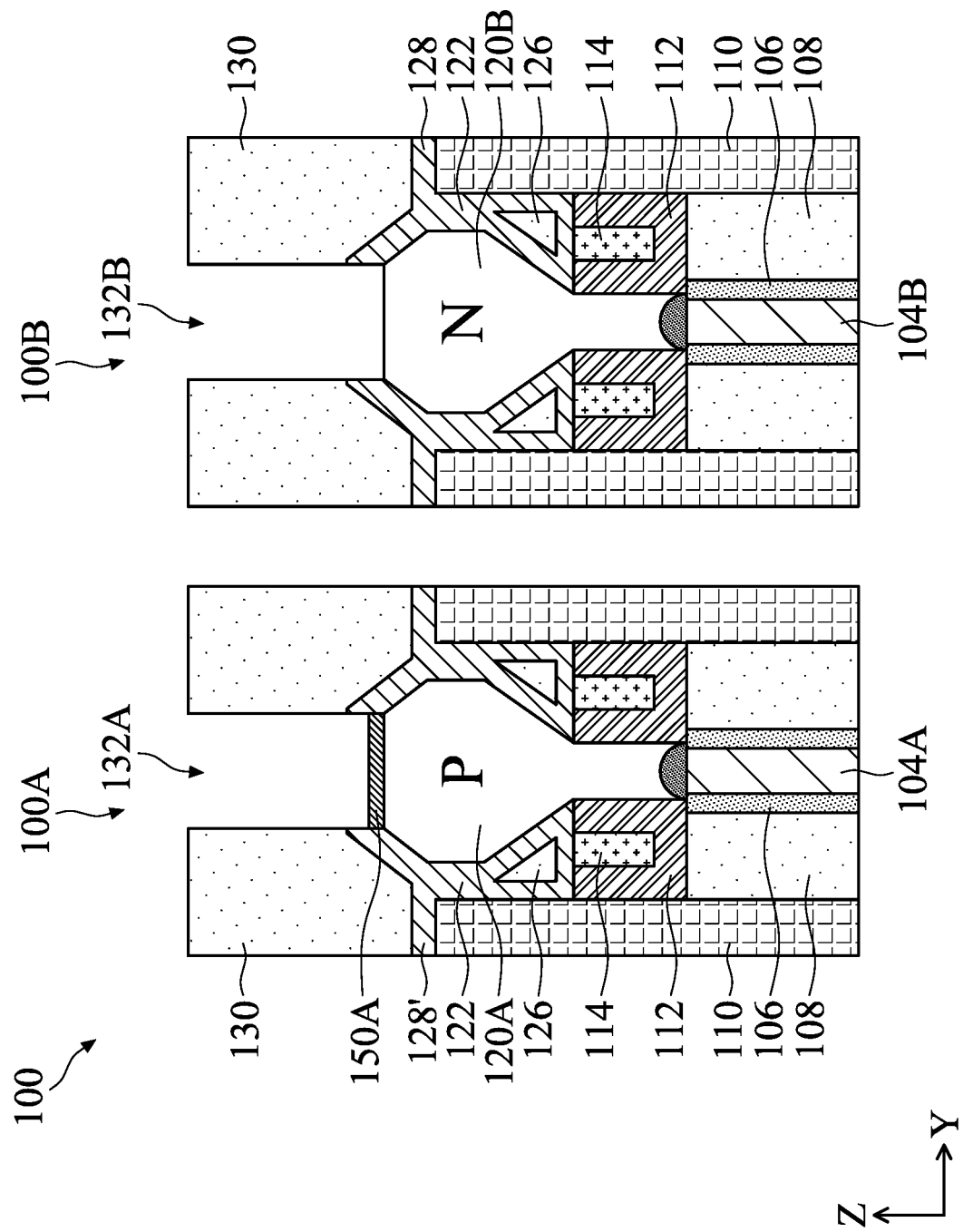

Referring now to FIG. 11 and block 214 of FIG. 15, another etching process is employed to remove the protective layer 137 and the remaining portions of the metal layer 136A from both the trenches 132A and 132B. Furthermore, the etching process is configured to remove the capping layer 138' in the trench 132B without substantially etching the silicide layer 150A in the trench 132A. In other words, this etching process is a selective etching process. As described above, this may be achieved because of the etching selectivity between the layers due to their different Ge concentrations. Any etching methods may be employed, such as wet etching methods. And any suitable etching chemical may be used. In some embodiments, the etching rate of the capping layer 138' in the etching chemical is at least 10 times greater than the etching rate of the silicide layer 150A in the same etching chemical. Accordingly, the silicide layer 150A is only minimally affected by the etching process. As a result of the etching process, the top surface of the n-type source/drain feature 120B is exposed in the trench 132B, while the top surface of the p-type source/drain feature 120A remains covered under the silicide layer 150A. Moreover, the silicide layer 150A is exposed in the trench 132A.

Figure 12:
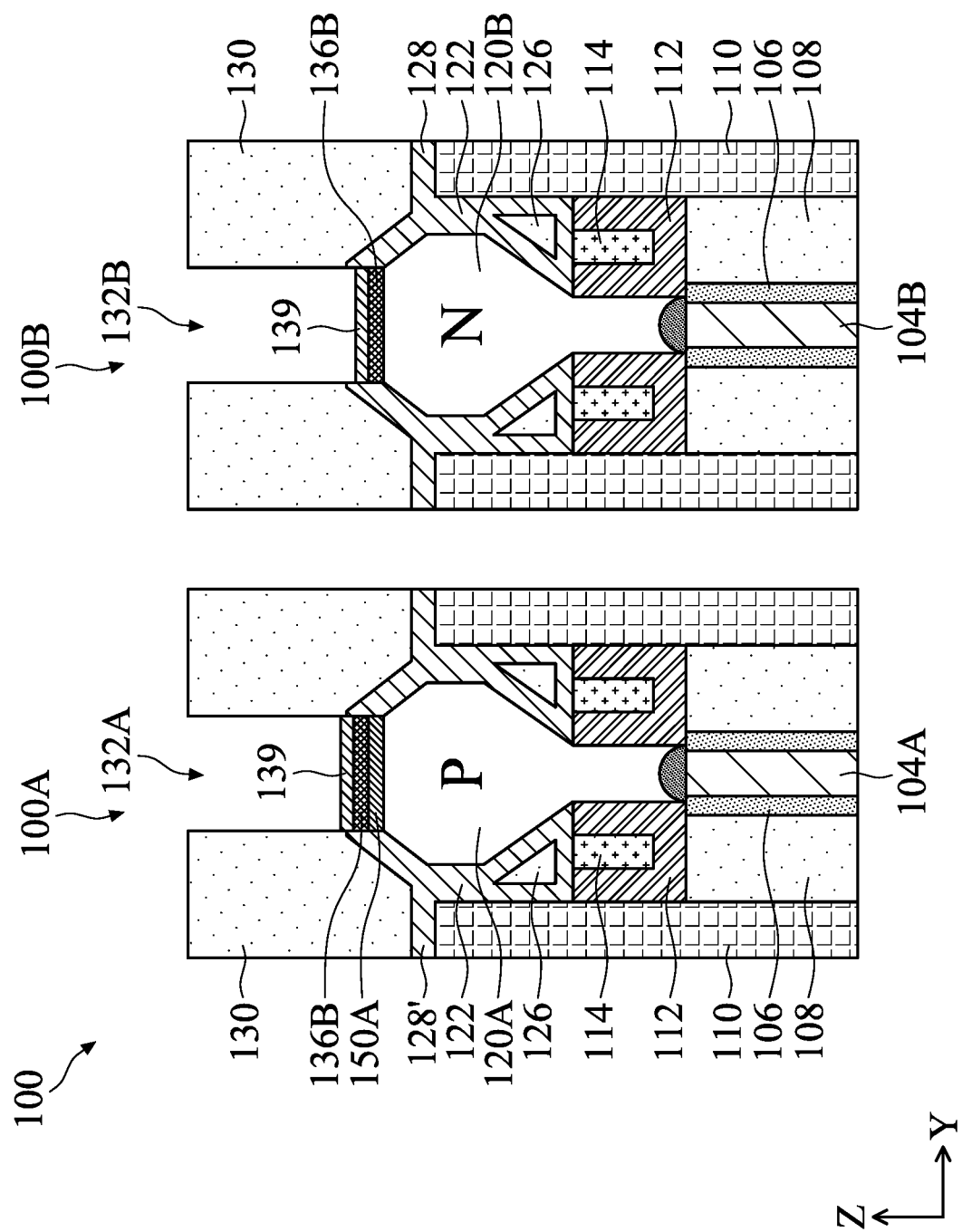

Referring to FIG. 12 and block 216 of FIG. 15, a metal layer 136B having an n-type work function metal is formed in the trenches 132A and 132B. N-type work function metals are metals that have work function values less (or lower) than the Fermi level of the semiconductor. The n-type work function metal may be any suitable n-type work function metals, such as titanium (Ti), aluminum (Al), ytterbium (Yb), silver (Ag), TaAl, TaAlC, TiAlN, TaC, TaCN, TaSiN, manganese (Mn), zirconium (Zr), or combinations thereof. For example, the metal layer 136B is formed over the silicide layer 150A in the trench 132A such that it directly contacts the silicide layer 150A; and formed over the n-type source/drain feature 120B in the trench 132B such that it directly contacts the top surface of the n-type source/drain feature 120B. In some embodiments, the metal layer 136B also directly contacts the sidewall surfaces of the remaining portions of the etch-stop layers 128' and 128 exposed in the trenches 132A and 132B. In some embodiments, the metal layer 136B has a thickness of about 5 nm to about 10 nm. If the thickness is too small, such as less than 5 nm, thermal agglomeration and/or discontinuous islanding may cause the formed silicide layers to be non-uniform, thereby having limited efficacy in reducing the contact resistances. If the silicide layer thickness is too large, such as greater than 10 nm, it may unnecessarily take up valuable space that may be otherwise used by other important features of the semiconductor device 100. In some embodiments, a protective layer 139 is formed over the metal layer 136B. As a result, the trenches 132A and 132B each has a bottom surface defined by the top surface of the protective layer 139.

Figure 13:
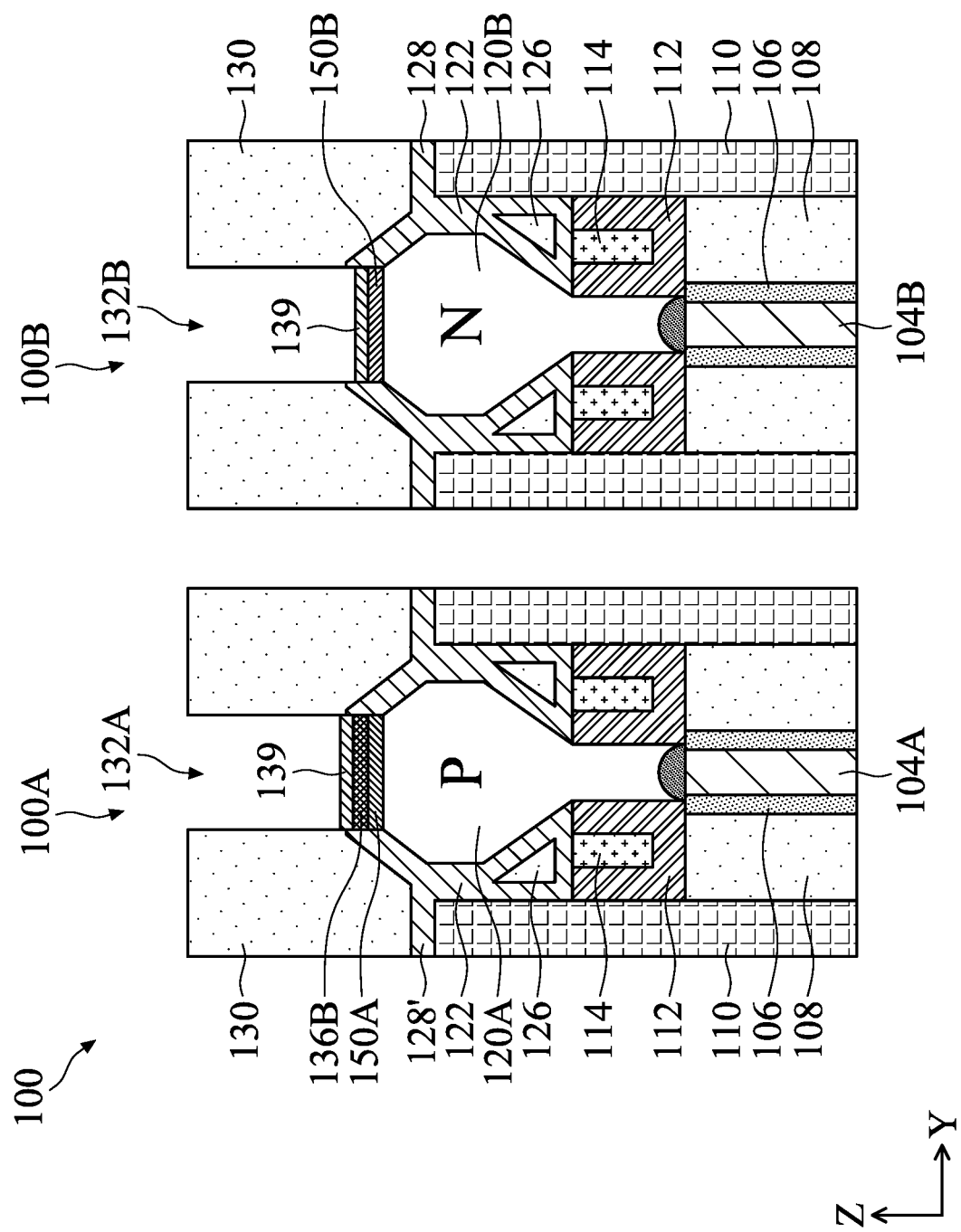

Referring to FIG. 13 and block 218 of FIG. 15, the semiconductor device 100 is subject to another heating treatment. For example, the semiconductor device 100 is annealed at a temperature of about 300° C. to about 400° C. in an inert environment. Similar to the heating treatment process described above, various parameters may be adjusted to facilitate the chemical reaction that forms a silicide layer. Accordingly, the heating treatment process induces a chemical reaction between the n-type work function metal in the metal layer 136B with the semiconductor material in the n-type source/drain feature 120B. As a result, a silicide layer 150B is formed in the trenches 132B. In some embodiments, the n-type source/drain feature 120B includes silicon (Si). Accordingly, the silicide layer 150B includes Si and the n-type work function metal. In some embodiments, the silicide layer 150B includes titanium silicon (TiSi), titanium aluminum silicon (TiAlSi), other silicide materials, or combinations thereof. As a result of the chemical reaction, the thickness of the n-type source/drain feature 120B (such as along the Z-direction) is reduced, and the thickness of the metal layer 136B in the trench 132B is reduced. In some embodiments, the entirety of the metal layer 136B is converted into the silicide layer 150B. In other words, the thickness of the metal layer 136B in the trench 132B is reduced to zero. Accordingly, the silicide layer 150B directly contacts and interface with the protective layer 139 in the trenches 132B. In other embodiments, the heating treatment partially converts the metal layer 136B into the silicide layer 150B, such that a top portion of the metal layer 136B remains unchanged. In other words, a portion of the metal layer 136B covers the top surface of the silicide layer 150B, and interposes between the silicide layer 150B and the protective layer 139. In some embodiments, the silicide layer 150B has a thickness of about 5 nm to about 10 nm. If the silicide layer thickness is too small, for example, less than 5 nm, the silicide layer may have limited efficacy in reducing the contact resistances; if the silicide layer thickness is too large, such as greater than 10 nm, it may unnecessarily take up valuable space for other device features. In some embodiments, the metal layer 136B do not react with the silicide layer 150A in the trench 132A.

Figure 14:
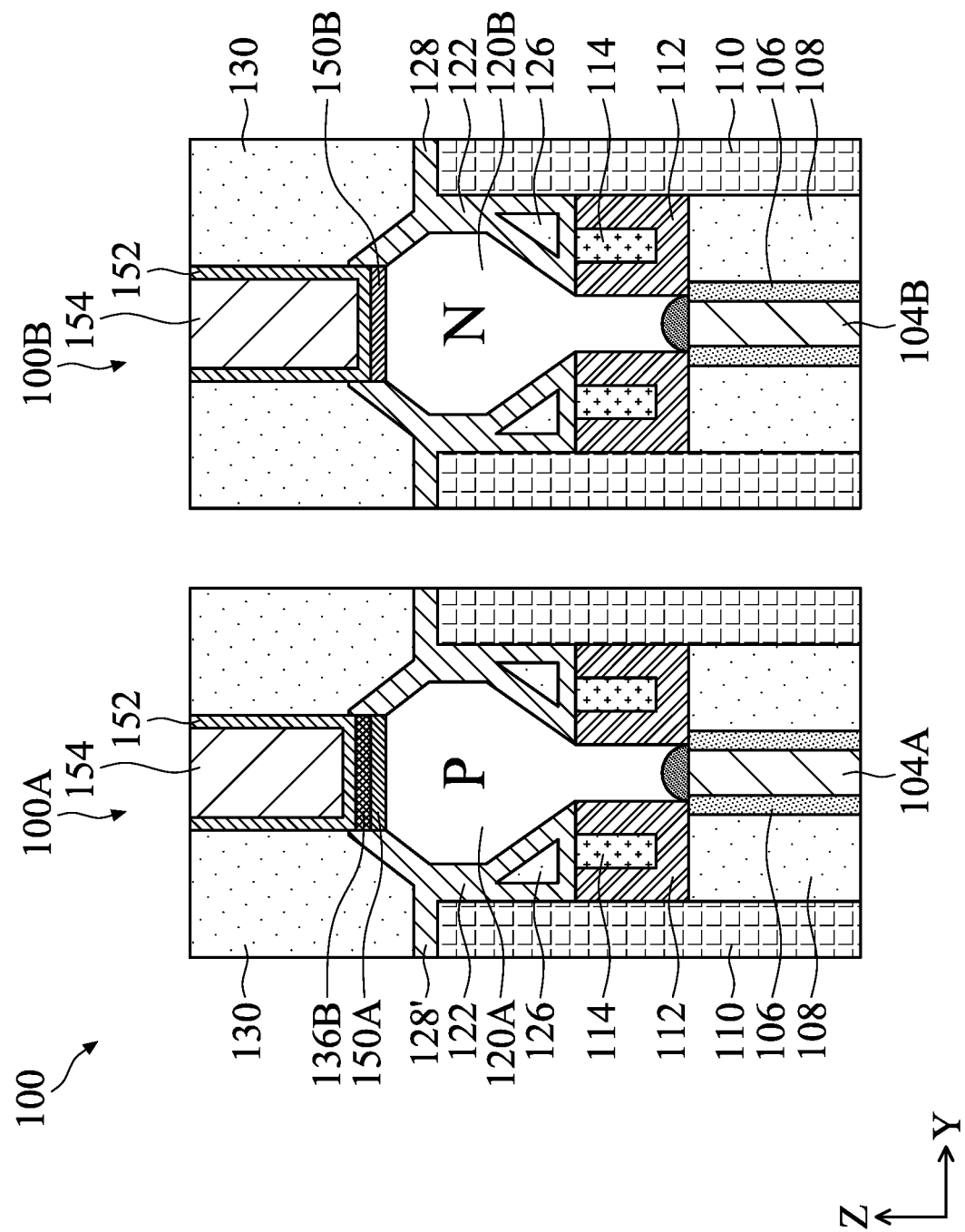
Figure 15:
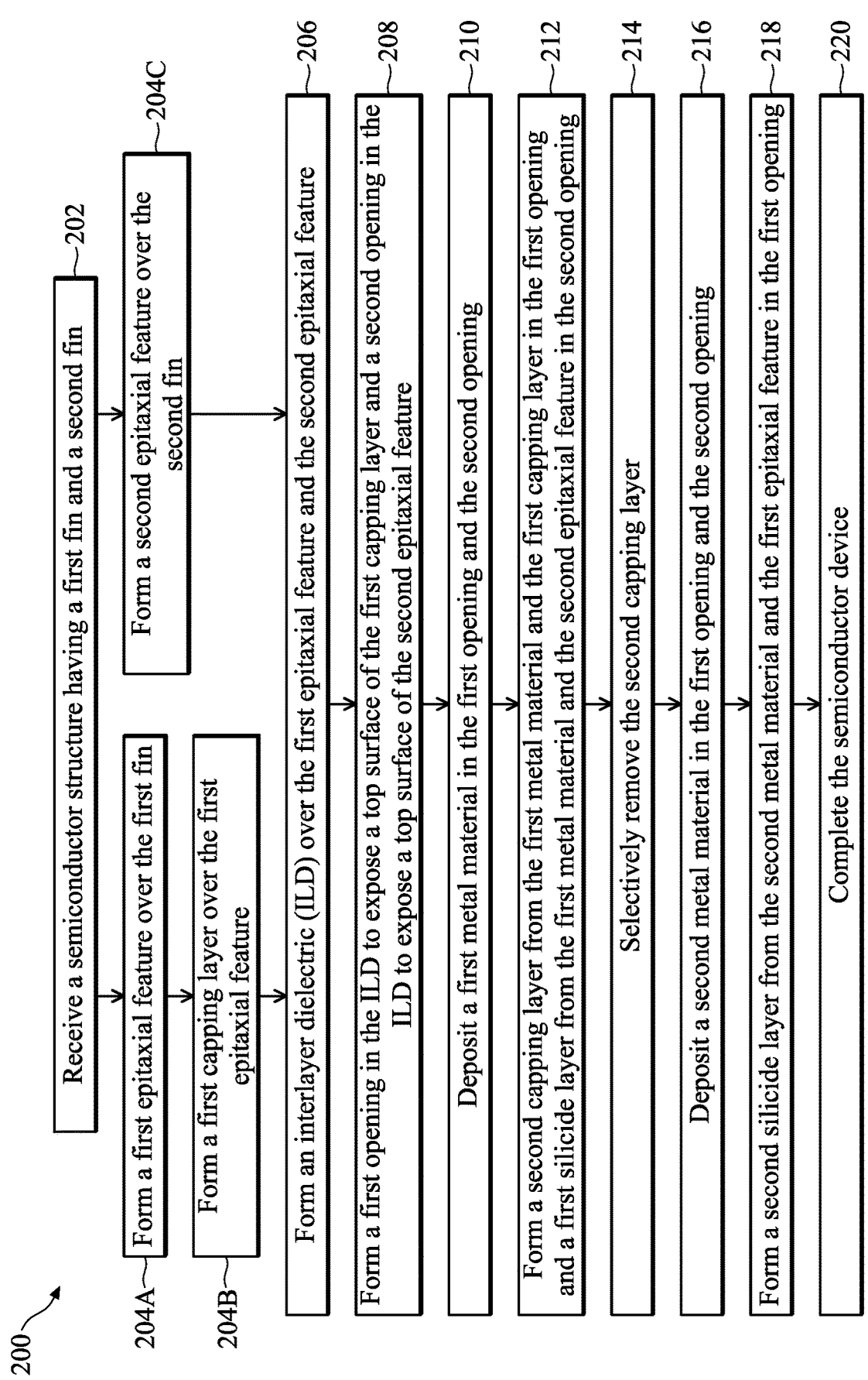
FIG. 15 is a process flow of a method for fabricating a semiconductor device according to various aspects of the present disclosure.

Referring to FIG. 14 and block 220 of FIG. 15, contact features are formed in the remaining spaces of the trenches 132A and 132B such that they are entirely filled. Any suitable methods may be used to form the contact features 154, such as by PVD, CVD, MOCVD, and/or other suitable technique. In some embodiments, a Chemical Mechanical Polishing (CMP) operation is conducted to planarize the top surface of the semiconductor device 100 and expose the ILD layer 130.

Accordingly, the semiconductor device 100 has a silicide layer 150A between the p-type source/drain feature 120A and the contact feature 154, and a silicide layer 150B between the n-type source/drain feature 120B and the contact feature 154. In other words, the semiconductor device 100 has a dual silicide structure.

The disclosure above describes forming of the silicide layer over the p-type source/drain features prior to forming the silicide layer over the n-type source/drain features. However, this sequence may be reversed without departing from the spirit of the present invention. In other words, the present disclosure also encompasses the embodiment where the silicide layer 150B over the n-type source/drain features 120B are formed prior to the formation of the silicide layer 150A over the p-type source/drain features 120A. Furthermore, it is understood that additional processes may be performed before, during, or after the steps 202-220. For example, the method 200 may include steps of forming various vias, wires, and multilayer interconnect features (e.g., metal layers and interlayer dielectrics) to connect the various features to form a functional circuit.

In summary, the present disclosure provides a method of forming dual silicide structures involving fewer photolithography patterning operations and/or fewer hard mark layers. Accordingly, dual silicide structures may be formed more reliably and/or more economically. This present disclosure may be applicable to not only the present technology nodes, but also to future generations of technology nodes. There are several distinct physical characteristics associated with the semiconductor device 100 due to the unique fabrication process flow of the present disclosure. For example, the semiconductor device 100 includes a first silicide layer 150A over the p-type source/drain feature 120A and a second silicide layer 150B over the n-type source/drain feature 120B. The first silicide layer 150A includes a p-type work function metal, and the second silicide layer 150B includes an n-type work function metal. A metal layer 136B having the n-type work function metal (that is the same as a component of the second silicide layer 150B) covers the first silicide layer 150A over the p-type source/drain feature 120A. In other words, the metal layer 136B interposes between the first silicide layer 150A and the contact features 154 in the device component 100A. However, no such metal layer 136B interposes between the second silicide layer 150B and the contact feature 154 in the device component 100B. Alternatively in some embodiments, metal layer 136B may be present in both the device component 100A and the device component 100B, however, the thickness of the metal layer 136B in the device component 100B is substantially smaller than that of the metal layer 136B in the device component 100A. In some embodiments, the metal layer 136B extends horizontally from a sidewall surface of the etch stop layer to an opposing sidewall surface of the etch stop layer over the p-type source/drain feature.

Based on the above discussions, it can be seen that the embodiments of the present disclosure offer advantages over conventional technologies for making dual silicide structures. It is understood, however, that no particular advantage is required, other embodiments may offer different advantages, and that not all advantages are necessarily disclosed herein. One advantage is the reduced numbers of photolithography patterning that is required to form the desired dual silicide structures. As discussed above, in conventional technologies, the dual silicide structures are formed by multiple photolithography patterning using multiple hard mask layers. Such repeated photolithography operations have become increasingly challenging at the ever-shrinking dimensions found in advanced technology nodes. The method provided herein mitigates such challenges by utilizing self-aligned processes, such that reliability and economics are improved. Additionally, the processes of the present disclosure are compatible with existing fabrication process flow and are easy and cheap to implement. Furthermore, the processes of the present disclosures may be applicable to future generations of advanced technologies nodes.

One general aspect of the disclosure is directed to a method. The method includes receiving a semiconductor structure having a first fin in a first device region and a second fin in a second device region. The method also includes forming a first epitaxial feature on the first fin, where the first epitaxial feature has a first type dopant. The method further includes forming a first capping layer over the first epitaxial feature. Moreover, the method includes forming a second epitaxial feature on the second fin, where the second epitaxial feature has a second type dopant. The second type dopant is different from the first type dopant. Furthermore, the method includes depositing a first metal material over and directly contacting the second epitaxial feature. The first metal material is also deposited over and directly contacting the first capping layer. Still further, the method includes forming a first silicide layer from the first metal material and the second epitaxial feature, and forming a second capping layer from the first metal material and the first capping layer. Additionally, the method includes selectively removing the second capping layer, depositing a second metal material over and directly contacting the first epitaxial feature as well as over the second epitaxial feature, and forming a second silicide layer from the second metal material and the first epitaxial feature.

In some embodiments, the forming of the first epitaxial feature on the first fin includes forming a first mask element. The first mask element covers the second device region and has an opening to expose the first device region. The forming of the first epitaxial feature on the first fin also includes recessing the first fin in first source/drain regions to form first source/drain trenches, and forming the first epitaxial feature in the first source/drain trenches. Moreover, the forming of the second epitaxial feature on the second fin includes forming a second mask element. The second mask element covers the first device region and has an opening over the second device region. The forming of the second epitaxial feature on the second fin also includes recessing the second fin in second source/drain regions to form second source/drain trenches, and forming the second epitaxial feature in the second source/drain trenches. Furthermore, the forming of the first capping layer includes epitaxially growing the first capping layer within the opening of the mask element and removing the first mask element after the forming of the first capping layer. In some embodiments, the forming of the first epitaxial feature includes forming in a fabrication tool under vacuum. Moreover, the forming of the first capping layer includes forming in the fabrication tool without breaking the vacuum. In some embodiments, the forming of the first capping layer includes forming the first capping layer without p-type or n-type doping species. In some embodiments, the first type dopant is an n-type dopant, and the second type dopant is a p-type dopant. Moreover, the first capping layer includes silicon germanium (SiGe) with Ge at a first concentration greater than 60% by atomic percentage, while the second epitaxial feature includes SiGe with Ge at a second concentration less than 50% by atomic percentage. In some embodiments, the selectively removing of the second capping layer includes selectively removing at a selective etching condition, where the first silicide layer has a first etching rate under the selective etching condition, the second capping layer has a second etching rate under the selective etching condition, and a ratio of the second etching rate to the first etching rate exceeds 10:1. In some embodiments, the first metal material is a p-type metal material, and the second metal material is an n-type metal material. In some embodiments, the method further includes forming contact features over the first silicide layer and over the second silicide layer. In some embodiments, the depositing of the second metal material includes depositing the second metal material over the first silicide layer such that the second metal material directly contacts the first silicide layer.

One general aspect is directed to a method. The method includes receiving a semiconductor substrate, and forming a mask covering a first device region while exposing a second device region within an opening of the mask. The method also includes forming an n-type epitaxial feature in the exposed second device region through the opening of the mask, forming a first capping layer over the n-type epitaxial feature through the opening of the mask, and forming a p-type epitaxial feature in the first device region. The method further includes forming a first silicide layer over the p-type epitaxial feature and a second capping layer over the n-type epitaxial feature. Moreover, the method includes selectively removing the second capping layer without substantially removing the first silicide layer. Furthermore, the method includes forming a second silicide layer over the n-type epitaxial feature.

In some embodiments, the method further includes forming a first metal layer over the p-type epitaxial feature and over the n-type epitaxial feature, as well as forming a second metal layer over the p-type epitaxial feature and over the n-type epitaxial feature. The forming of the first silicide layer over the p-type epitaxial feature includes annealing to form the first silicide layer from the first metal layer, while the forming of the second capping layer over the n-type epitaxial feature includes annealing to form from the first metal layer and the first capping layer. Furthermore, the forming of the second silicide layer over the n-type epitaxial feature includes annealing to form the second silicide layer from the second metal layer. In some embodiments, the forming of the first metal layer over the p-type epitaxial feature includes forming the first metal layer interfacing with the p-type epitaxial feature, and the forming of the first metal layer over the n-type epitaxial feature includes forming the first metal layer interfacing with the first capping layer. In some embodiments, the forming of the n-type epitaxial feature includes forming from a first precursor in a first tool under vacuum, and the forming of the first capping layer includes forming from a second precursor in the first tool following the forming of the n-type epitaxial feature without breaking the vacuum. In some embodiments, the forming of the first capping layer includes adjusting a concentration of the second precursor based on an etching property of the second capping layer. In some embodiments, the forming of the first capping layer includes forming the first capping layer having germanium (Ge) at a concentration by atomic percentage greater than 60%, while the forming of the p-type epitaxial feature includes forming the p-type epitaxial feature having the Ge at a concentration by atomic percentage less than 50%. In some embodiments, the forming of the p-type epitaxial feature includes forming with a p-type dopant, while the forming of the first capping layer includes forming without a p-type or n-type dopant.

One general aspect is directed to a semiconductor device. The semiconductor device includes a semiconductor substrate, a first epitaxial feature and a second epitaxial feature. The first epitaxial feature has a first semiconductor material over the semiconductor substrate. The second epitaxial feature has a second semiconductor material over the semiconductor substrate, where the second semiconductor material is different from the first semiconductor material. The semiconductor device also includes a first silicide layer over and physically contacting the first epitaxial feature and a second silicide layer over and physically contacting the second epitaxial feature. The first silicide layer includes an element of the first semiconductor material and a first metal material. The second silicide layer includes an element of the second semiconductor material and a second metal material, where the second metal material is different from the first metal material. The semiconductor device additionally includes the second metal material over and directly contacting the first silicide layer.

In some embodiments, the first epitaxial feature includes a p-type dopant, and the second epitaxial feature includes an n-type dopant. Moreover, the first metal material is a p-type work function metal, and the second metal material is an n-type work function metal. In some embodiments, the semiconductor device further includes an etch-stop layer on side surfaces of the first epitaxial feature, and the second metal material directly contacts the etch-stop layer. In some embodiments, the first epitaxial feature includes silicon germanium, and the second epitaxial feature includes silicon.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate;
   a first epitaxial feature having a first semiconductor material over the semiconductor substrate;
   a second epitaxial feature having a second semiconductor material over the semiconductor substrate, the second semiconductor material being different from the first semiconductor material;
   a first silicide layer on the first epitaxial feature;
   a second silicide layer on the second epitaxial feature;
   a metal layer on the first silicide layer;
   a first contact feature over the metal layer; and
   a second contact feature over the second silicide layer, wherein a first number of layers between the first contact feature and the first epitaxial feature is greater than a second number of layers between the second contact feature and the second epitaxial feature,
   wherein the first silicide layer includes an element of the first semiconductor material and a first metal material, the second silicide layer includes an element of the second semiconductor material and a second metal material, and the second metal material is different from the first metal material.

2. The semiconductor device of claim 1, wherein the first metal material is a p-type metal material, and the second metal material is an n-type metal material.

3. The semiconductor device of claim 1, wherein the first semiconductor material includes a p-type dopant, and the second semiconductor material includes an n-type dopant.

4. The semiconductor device of claim 1, wherein the metal layer and the second silicide layer both include a same metal material.

5. The semiconductor device of claim 4, wherein the same metal material is an n-type metal material.

6. The semiconductor device of claim 1, further comprising:
   a first glue layer disposed between the metal layer and the first contact feature; and
   a second glue layer disposed between the second silicide layer and the second contact feature,
   wherein the metal layer separates the first silicide layer from contacting the first glue layer.

7. The semiconductor device of claim 1, further comprising:
   an etch-stop layer disposed on sidewalls of the first epitaxial feature and the metal layer.

8. The semiconductor device of claim 1, wherein the metal layer has a thickness ranging from about 5 nm to about 10 nm.

9. The semiconductor device of claim 1, wherein the first silicide layer includes NiPtSi, and the second silicide layer includes TiSi.

10. A semiconductor device, comprising:
    a substrate;
    an isolation feature over the substrate;
    a fin protruding from the substrate and through the isolation feature;
    an epitaxial feature over the fin, the epitaxial feature having a semiconductor material of a first conductivity type;
    a silicide feature over the epitaxial feature, the silicide feature having an element of the semiconductor material and a first metal of the first conductivity type;
    a metal layer over the silicide feature, the metal layer having a second metal of a second conductivity type opposite to the first conductivity type; and
    a contact feature over the metal layer, wherein a topmost portion of the metal layer is under a bottom surface of the contact feature.

11. The semiconductor device of claim 10, wherein the semiconductor material includes silicon germanium.

12. The semiconductor device of claim 11, wherein an atomic percentage of germanium in the epitaxial feature is less than about 50%.

13. The semiconductor device of claim 10, wherein the first conductivity type is p-type, and the second conductivity type is n-type.

14. The semiconductor device of claim 13, wherein the first metal is a p-type work function metal, and the second metal is an n-type work function metal.

15. The semiconductor device of claim 10, further comprising:
    first and second dielectric fins sandwiching the fin and the epitaxial feature.

16. The semiconductor device of claim 14, wherein the isolation feature separates the first and second dielectric fins from contacting the substrate.

17. The semiconductor device of claim 10, further comprising:
    a dielectric layer disposed on sidewalls of the epitaxial feature, the silicide feature, and the metal layer.

18. A method, comprising:
    receiving a semiconductor structure having a first fin in a first device region and a second fin in a second device region;
    forming a first epitaxial feature on the first fin, the first epitaxial feature having a first type dopant;
    forming a second epitaxial feature on the second fin, the second epitaxial feature having a second type dopant, wherein the second type dopant is different from the first type dopant;

depositing a first metal material over the first and second epitaxial features, wherein the first metal material reacts with the first epitaxial feature in forming a first silicide feature;

removing the first metal material from the second device region to expose the second epitaxial feature;

depositing a second metal material over the first silicide feature and the second epitaxial feature, wherein the second metal material reacts with the second epitaxial feature in forming a second silicide feature;

forming a first contact feature above the second metal material in the first device region; and forming a second contact feature above the second silicide feature in the second device region.

19. The method of claim 18, wherein the first type dopant is a p-type dopant, and the second type dopant is an n-type dopant.

20. The method of claim 18, wherein the first metal material is a p-type work function metal, and the second metal material is an n-type work function metal.

* * * * *